United States Patent
Lu et al.

(10) Patent No.: US 10,274,387 B2
(45) Date of Patent: Apr. 30, 2019

(54) PRESSURE SENSING DEVICE AND PRESSURE SENSING APPARATUS

(71) Applicant: National Chiao Tung University, Hsinchu (TW)

(72) Inventors: Tsan-Wen Lu, Hsinchu (TW); Chun Wang, New Taipei (TW); Po-Tsung Lee, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 328 days.

(21) Appl. No.: 15/423,594

(22) Filed: Feb. 3, 2017

(65) Prior Publication Data
US 2018/0094995 A1     Apr. 5, 2018

(30) Foreign Application Priority Data
Oct. 3, 2016 (TW) .............................. 105131875 A

(51) Int. Cl.
*G01L 1/00* (2006.01)
*G01L 1/24* (2006.01)
(Continued)

(52) U.S. Cl.
CPC ........ *G01L 7/026* (2013.01); *H01L 31/02327* (2013.01); *H01L 31/16* (2013.01);
(Continued)

(58) Field of Classification Search
CPC ..... G01L 1/00; G01L 7/00; G01L 7/02; G01L 7/026; H01L 31/00; H01L 31/0327;
(Continued)

(56) References Cited

U.S. PATENT DOCUMENTS 3,578,864 A *  5/1971  Ross .................. G01B 11/16
                                                                356/32
7,283,716 B2  10/2007  Park et al.
(Continued)

FOREIGN PATENT DOCUMENTS

CN      101771240      7/2010
DE      102011000941   8/2012
(Continued)

OTHER PUBLICATIONS

T. W. Lu et al., "Tunable nanoblock lasers and stretching sensors", Nanoscale Aug. 8, 2016, 16769~16775.
(Continued)

*Primary Examiner* — Nguyen Q. Ha
(74) *Attorney, Agent, or Firm* — JCIPRNET

(57) ABSTRACT

A pressure sensing device including a light source, at least one resonant structure, a cladding body, a first substrate and a second substrate is provided. The light source is configured to provide an original broadband light. The resonant structure includes a plurality of semiconductor rod structures arranged into a row at intervals along a single arranging direction, and each of the semiconductor rod structures has a lattice constant on the arranging direction. The original broadband light is transmitted between the semiconductor rod structures, and a resonant light is produced, wherein each of the semiconductor rod structures has a length perpendicular to the arranging direction and has a width parallel to the arranging direction, the length and the width are less than the wavelength of the resonant light. The cladding body completely covers the semiconductor rod structures of the at least one resonant structure. The cladding body and the at least one resonant structure are interposed between the first substrate and the second substrate. When a pressure is applied on at least one of the first substrate and the second substrate, the pressure is transmitted to the
(Continued)

cladding body along a direction perpendicular to the arranging direction, a deformation corresponding to the pressure is occurred on the cladding body and the semiconductor rod structures on the arranging direction, and a wavelength of the resonant light is changed according to the deformation. Besides, a pressure sensing apparatus is also provided.

20 Claims, 15 Drawing Sheets

(51) Int. Cl.
    *G01L 7/02*       (2006.01)
    *H01L 31/00*      (2006.01)
    *H01L 31/0232*    (2014.01)
    *H01L 31/16*      (2006.01)
    *H01S 5/00*       (2006.01)
    *H01S 5/06*       (2006.01)
    *H01S 5/12*       (2006.01)

(52) U.S. Cl.
    CPC .......... *H01S 5/0028* (2013.01); *H01S 5/0607* (2013.01); *H01S 5/12* (2013.01)

(58) Field of Classification Search
    CPC ......... H01L 31/16; H01S 5/00; H01S 5/0028; H01S 5/06; H01S 5/0607; H01S 5/12
    See application file for complete search history.

(56) References Cited

U.S. PATENT DOCUMENTS

| | | | |
|---|---|---|---|
| 7,426,025 B2 | 9/2008 | Wang | |
| 8,849,073 B2* | 9/2014 | Vigneaux | G01L 1/246 385/13 |
| 9,130,347 B2 | 9/2015 | Scofield et al. | |
| 9,574,956 B2* | 2/2017 | Reck | G01L 11/02 |
| 10,072,991 B2* | 9/2018 | Nayfeh | G01L 1/24 |
| 2010/0108870 A1* | 5/2010 | Kramer | G01L 1/24 250/231.19 |
| 2013/0199310 A1* | 8/2013 | Fujino | G01L 1/241 73/862.624 |
| 2016/0025563 A1* | 1/2016 | Burgett | G01J 5/041 250/227.17 |
| 2016/0069756 A1* | 3/2016 | Kim | G06F 3/0421 73/862.624 |

FOREIGN PATENT DOCUMENTS

| | | |
|---|---|---|
| TW | 200535472 | 11/2005 |
| TW | 200713421 | 4/2007 |
| TW | 200807701 | 2/2008 |
| TW | 201020540 | 6/2010 |
| TW | 201226883 | 7/2012 |
| TW | M432840 | 7/2012 |
| TW | M502841 | 6/2015 |

OTHER PUBLICATIONS

Guilin Mao et al., "Co-extruded mechanically tunable multilayer elastomer laser", Optics Material Express Apr. 1, 2011,108~114.
Kyung-Jo Kim et al., "Flexible Polymeric Tunable Lasers for WDM Passive Optical Networks", Journal of Lightwave Technology Mar. 31, 2013, 982~987.
Chun L. Yu et al., "Stretchable Photonic Crystal Cavity with Wide Frequency Tunability", Nano Letters Jan. 13, 2013, 248~252.
Min-Hsiung Shih et al., "Compact Tunable Laser with InGaAsP Photonic Crystal Nanorods for C-Band Communication", IEEE Journal of Selected Topics in Quantum Electronics Jun. 21, 2015, 1~5.

* cited by examiner

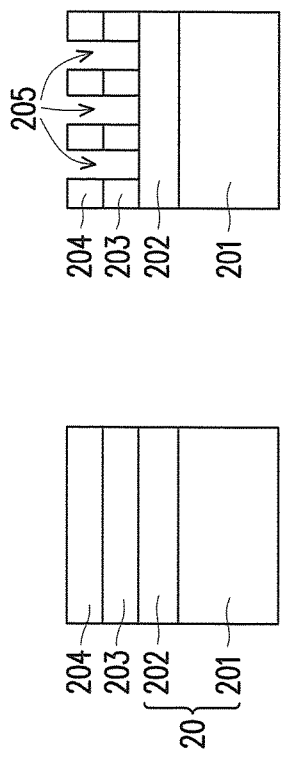
FIG. 2A
FIG. 2B
FIG. 2C
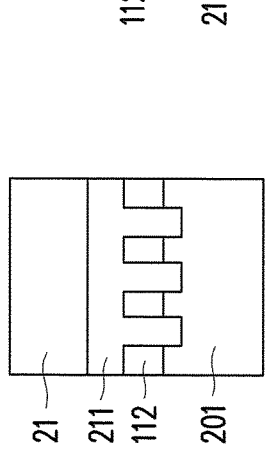
FIG. 2D
FIG. 2E
FIG. 2F

PRESSURE SENSING DEVICE AND PRESSURE SENSING APPARATUS

CROSS-REFERENCE TO RELATED APPLICATION

This application claims the priority benefit of Taiwan application serial no. 105131875, filed on Oct. 3, 2016. The entirety of the above-mentioned patent application is hereby incorporated by reference herein and made a part of this specification.

BACKGROUND OF THE INVENTION

1. Field of the Invention

The present invention relates to a sensing device and a sensing apparatus with an adjustable resonant wavelength, and particularly relates to a pressure sensing device and a pressure sensing apparatus having adjustable laser.

2. Description of Related Art

Through the design of different defects inside the refractive index periodic artificial meta-material having photonic band and photonic band gap effect, the refractive index periodic artificial meta-material has been widely applied in the wavelength scale in recent years, and guides, prohibits or restricts the light waves with extremely low optical loss. Compared to the traditional micro-optical system based on the total reflection effect, the building of the photonic integrated chip with various nano-optical components based on above-mentioned artificial meta-material has the advantages of lower loss, high component density, smaller integrated dimension, and so on.

Through the design of localized defect in such artificial meta-material, the nanocavity with extremely low optical loss can be formed. The resonance mode within cavity usually has the characteristics of single wavelength, high coherence, high directional radiation. Currently, such nanocavity has been adapted to achieve the optical components such as filters, switches, buffers, light-emitting diodes, lasers, solar cells, etc.

However, due to the compromise of the process simplicity and yielding requirements in manufacturing process, such nanocavity components are mostly manufactured on the two dimensional thin slab based on semiconductor or other dielectric materials. Although the nanocavity has a size close to the wavelength size, the meta-material arranged and expanded in two dimensions leads to disadvantage of extremely large device footprints of the components.

In addition, such nanocavity device based on meta-material having geometric difference with the optical waveguides commonly used in the photonic integrated chips. Generally, for achieving the low-loss optical interconnection, complicated geometric designs are needed. That is, such nanocavity device has the disadvantage of low compatibility with the traditional optical waveguide.

On the other hand, the resonant wavelength adjustability of such nanocavity devices have been widely discussed in literatures. Specifically, the wavelength adjustability mentioned herein is referred to as "reversible and repeatable wavelength adjusting". The principle of adjusting the resonant wavelength lies in changing the resonant condition of the nanocavity through applied variables. Currently, the methods of adjusting the resonant wavelength can be divided into two ways.

The first way is changing the refractive index of the nanocavity itself or the surrounding mediums. About the change of the refractive index of the nanocavity, it can be achieved by methods of changing the temperature of the nanocavity, concentration of the injection of free carrier, and so on. About the change of the refractive index of the surrounding materials, it can be achieved by adjusting the concentrations of the refractive-index-adjustable gas and liquid, or liquid crystals able to be changed in their refractive index by voltage controlling. However, in the above methods, the range of the wavelength adjustability is usually limited by the variable range of the refractive index of the material.

The second way to achieve wavelength adjustability is directly changing the nanocavity structure. For instance, the wavelength adjustability can be achieved by the methods such as approaching the nanocavity by external perturbation (such as nano-micro-probe, micro-fiber), or changing the coupling length of the resonance mode using the microelectromechanical systems. Although these methods can obtain high wavelength adjustability, the design of complicated structures is usually needed to achieve significant change of the micro-structure. That results in their difficulty in integrating within the integrated photonic chip.

Therefore, the issue of developing the optical component with adjustable resonant wavelength having characteristics such as smaller device footprint, high compatibility with the conventional optical waveguides, and high wavelength adjustability is one of the key development priorities in the field.

SUMMARY OF THE INVENTION

The invention provides a pressure sensing device with excellent sensing sensitivity and having smaller device footprint.

The invention provides a pressure sensing apparatus with excellent sensing sensitivity and having smaller device footprint.

The pressure sensing device of the embodiment of the invention includes a light source, at least one resonant structure, a cladding body, a first substrate and a second substrate. The light source is configured to provide an original broadband light. A resonant structure includes a plurality of semiconductor rod structures periodically arranged into a row along a single arranging direction, and each of the semiconductor rod structures has a lattice constant on the arranging direction. The original broadband light propagates in the semiconductor rod structures, and produces a resonant light. Each of the semiconductor rod structures has a length perpendicular to the arranging direction and has a width parallel to the arranging direction. The length and the width are shorter than the wavelength of the resonant light. The cladding body completely covers the semiconductor rod structures of the at least one resonant structure. The cladding body and the at least one resonant structure are interposed between the first substrate and the second substrate. When a pressure is applied on at least one of the first substrate and the second substrate, the pressure is transmitted to the cladding body in a direction perpendicular to the arranging direction. A deformation corresponding to the pressure is occurred on the cladding body and the semiconductor rod structures on the arranging direction. A wavelength of the resonant light changes according to the deformation.

In an embodiment of the invention, the pressure sensing device further includes a detector and a processor. The detector receives the resonant light to produce the spectral signal. The processor calculates a deformation value of the deformation according to a change of the spectral signal.

In an embodiment of the invention, the pressure sensing device further includes a first light-guiding portion and a second light-guiding portion. The first light-guiding portion and the second light-guiding portion are disposed in the cladding body along the arranging direction. The first light-guiding portion is configured to guide the original broadband light into a resonant structure, and the second light-guiding portion is configured to guide the resonant light into the detector.

In an embodiment of the invention, the first light-guiding portion, the semiconductor rod structures of a resonant structure and the second light-guiding portion are arranged into a row along the arranging direction. An end of the first light-guiding portion faces the light source, and another end of the first light-guiding portion faces the semiconductor rod structures. An end of the second light-guiding portion faces the semiconductor rod structures and another end of the second light-guiding portion faces the detector.

In an embodiment of the invention, the first light-guiding portion and the second light-guiding portion are connected to form into a light-guiding structure, and disposed beside the semiconductor rod structures of a resonant structure arranged along the arranging direction.

In an embodiment of the invention, the number of the at least one resonant structure is two. The resonant structures include a first resonant structure and a second resonant structure. The semiconductor rod structures of the first resonant structure are arranged into a first row, the semiconductor rod structures of the second resonant structure are arranged into a second row parallel and adjacent to the first row, and the semiconductor rod structures on the first row and the semiconductor rod structures on the second row have a gap on a gap direction perpendicular to the arranging direction.

In an embodiment of the invention, when the pressure is transmitted to the cladding body on a direction simultaneously perpendicular to the arranging direction and perpendicular to the gap direction, a deformation is occurred on the cladding body and the semiconductor rod structures of the resonant structures on the gap direction, so that the gap is changed. The wavelength of the resonant light changes according to the change of the gap.

In an embodiment of the invention, the light source is a back light source, disposed on a side of the cladding body, and a material of the semiconductor rod structures includes a semiconductor material having a direct bandgap.

In an embodiment of the invention, the pressure sensing device further includes a light-guiding structure disposed in the cladding body. The semiconductor rod structures of a resonant structure and the light-guiding structure are arranged into a row along the arranging direction. An end of the light-guiding structure faces the semiconductor rod structures and another end of the light-guiding structure faces the detector. The light-guiding structure is configured to guide the resonant light into the detector.

In an embodiment of the invention, the pressure sensing device further includes a light-guiding structure, disposed beside the semiconductor rod structures of a resonant structure arranged along the arranging direction, and an end of the light-guiding structure faces the detector. The resonant light enters the light-guiding structure through a coupling, and the light-guiding structure is configured to guide the resonant light into the detector.

The pressure sensing device of the embodiment of the invention includes a light source, a plurality of resonant structures, a cladding body, a first substrate and a second substrate. The light source is configured to provide an original broadband light. Each resonant structure includes a plurality of semiconductor rod structures arranged into a row at intervals along a single arranging direction, and each of the semiconductor rod structures has a lattice constant on the arranging direction. At least part of the resonant structures arranged along a first direction, wherein at least part of the resonant structures is arranged along a second direction different from the first direction. The original broadband light enters at least part of the resonant structures and is transmitted between the semiconductor rod structures, and a plurality of resonant lights are produced. Each of the semiconductor rod structures of a resonant structure has a length perpendicular to the arranging direction and has a width parallel to the arranging direction, and the length and the width is smaller than a wavelength of the resonant light. The cladding body completely covers the semiconductor rod structures of the resonant structures. The cladding body and the resonant structures are interposed between the first substrate and the second substrate. A pressure is applied on at least one of the first substrate and the second substrate, and the pressure is transmitted to the cladding body along a direction perpendicular to the arranging direction, a deformation corresponding to the pressure is occurred on the cladding body and the semiconductor rod structures of the resonant structures on the arranging direction, so that a value of the lattice constants is changed. The wavelength of the resonant lights changes according to the change of the lattice constants.

In an embodiment of the invention, the pressure sensing apparatus further includes a detector and a processor. The detector receives the resonant lights of at least part of the resonant structures to produce a plurality of spectral signals. The processor calculates an occurring location of the deformation and a deformation value of the deformation according to the spectral signals.

In an embodiment of the invention, the pressure sensing apparatus further includes a plurality of first light-guiding portions and a plurality of second light-guiding portions. A first light-guiding portion and a second light-guiding portion are disposed in the cladding body along the arranging direction. A first light-guiding portion is configured to guide the original broadband light into a resonant structure, and a second light-guiding portion is configured to guide the resonant light into the detector.

In an embodiment of the invention, an above-mentioned first light-guiding portion, the semiconductor rod structures of a resonant structure and a second light-guiding portion are arranged into a row along the arranging direction. An end of the first light-guiding portion faces the light source, and another end of the first light-guiding portion faces the semiconductor rod structures, an end of the second light-guiding portion faces the semiconductor rod structures and another end of the second light-guiding portion faces the detector.

In an embodiment of the invention, an above-mentioned first light-guiding portion and a second light-guiding portion are connected to form into a light-guiding structure, and disposed beside the semiconductor rod structures of a resonant structure arranged along the arranging direction. An end of the light-guiding structure faces the light source and another end of the light-guiding structure faces the detector.

In an embodiment of the invention, the resonant structures include a plurality of first resonant structures and a plurality of second resonant structures. The semiconductor rod structures of a first resonant structure are arranged into a first row, the semiconductor rod structures of a second resonant structure are arranged into a second row parallel and adjacent to the first row, and the semiconductor rod structures on the first row and the semiconductor rod structures on the second row have a gap on a gap direction perpendicular to the arranging direction.

In an embodiment of the invention, when the pressure is transmitted to the cladding body on a direction simultaneously perpendicular to the arranging direction and perpendicular to the gap direction, a deformation is occurred on the cladding body and the semiconductor rod structures of the resonant structures on the gap direction, so that the gap is changed. The wavelength of the resonant light changes according to the change of the gap.

In an embodiment of the invention, the light source is a back light source, disposed on a side of the cladding body, and a material of the semiconductor rod structures of the resonant structures includes a semiconductor material having a direct bandgap.

In an embodiment of the invention, the pressure sensing apparatus further includes a plurality of light-guiding structures disposed in the cladding body. The semiconductor rod structures of a resonant structure and a light-guiding structure are arranged into a row along the arranging direction. An end of the light-guiding structure faces the semiconductor rod structures and another end of the light-guiding structure faces the detector. The light-guiding structure is configured to guide the resonant light into the detector.

In an embodiment of the invention, the pressure sensing apparatus further includes a plurality of light-guiding structures. A light-guiding structure is disposed beside the semiconductor rod structures of a resonant structure arranged along the arranging direction, and an end of the light-guiding structure faces the detector. The resonant light enters the light-guiding structure through a coupling, and the light-guiding structure is configured to guide the resonant light into the detector.

Based on the above, in the pressure sensing device and the pressure sensing apparatus of an embodiment of the invention, a resonant structure includes a plurality of semiconductor rod structures arranged into a row at intervals along the arranging direction. The original broadband light is transmitted between the semiconductor rod structures, and produces a resonant light. In addition, the cladding body is configured to completely cover the semiconductor rod structures of the resonant structures. When an external force or pressure is applied on the cladding body, a deformation corresponding to the external force is occurred on the cladding body and the semiconductor rod structures. Therefore, in the pressure sensing device and the pressure sensing apparatus of the embodiment of the invention, the wavelength of the resonant light changes according to the deformation corresponding to the pressure, and the pressure sensing device and the pressure sensing apparatus sense the applied pressure according to the wavelength of the resonant light, so as to achieve the pressure sensing, and have excellent sensitivity and smaller device footprint.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2F illustrates the production flow chart of the optical device in the embodiment of FIG. 1A.

DESCRIPTION OF THE EMBODIMENTS

Figure 1A:
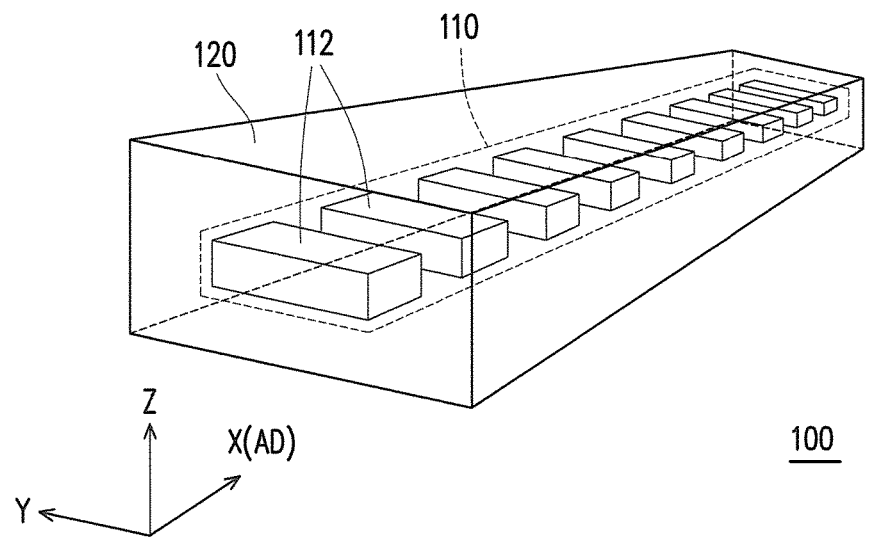
FIG. 1A is a perspective diagram of the optical device in an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a perspective diagram of the optical device in an embodiment of the present invention. Referring to FIG. 1A, in the embodiment, the optical device 100 includes at least one resonant structure 110 and a cladding body 120, the resonant structure 110 includes a plurality of semiconductor rod structures 112, the semiconductor rod structures are periodically arranged into a row at intervals along the arranging direction AD, and have a lattice constant $A_n$ on the arranging direction, $A_n$ represents the lattice constant of the n-th semiconductor rod structure 112 counted from the center to the both sides. The cladding body 120 completely covers the semiconductor rod structures 112 of the at least one resonant structure 110.

In the embodiment, the optical device 100 is located in a space constructed by a first axis X, a second axis Y, and a third axis Z, for example, wherein the first axis X is parallel to the arranging direction AD. The first axis X is perpendicular to the second axis Y and also perpendicular to the third axis Z, and the second axis Y is perpendicular to the third axis Z.

Figure 1B:
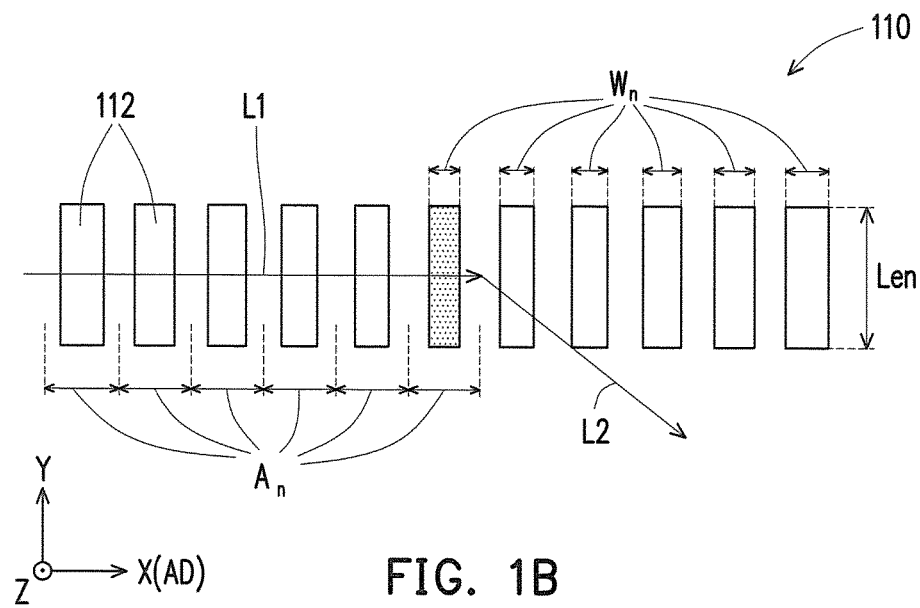
FIG. 1B is a top view of the resonant structure in the embodiment of FIG. 1A.

FIG. 1B is a top view of the resonant structure in the embodiment of FIG. 1A, please refer to FIG. 1B, specifically, each semiconductor rod structure 112 has a length Len perpendicular to the arranging direction AD and has the same width or different width $W_n$ parallel to the arranging direction AD. Among the above, $W_n$ represents the width of the n-th semiconductor rod structure 112 counted from the center to the both sides.

In the embodiment, the optical device 100 further includes a light source (not shown), configured to provide an original broadband light L1. The original broadband light L1 enters the resonant structure 110 and is transmitted between the semiconductor rod structures 112, wherein at least one resonant light L2 is included between the semiconductor rod structures 112, forms into a stationary wave along the arranging direction AD and is resonance amplified, the resonant light L2 is included in the original broadband light L1, and the full width at half maximum of the resonant light L2 on the spectrum is less than the full width at half maximum of the original broadband light L1 on the spectrum; the length Len and the width $W_n$ of the semiconductor rod structure 112 is less than the wavelength of the resonant light L2, and the wavelength of the resonant light L2 can be adjusted through changing the width $W_n$, the lattice constant $A_n$, and the length Len. Specifically, in some embodiments, the width $W_n$ of each of the semiconductor rod structures 112 are the same. However, in some embodiments, the semiconductor rod structures 112 of the resonant structure 110 can be designed to have different width $W_n$, so that the photonic band gap and the mode band gap effect is formed to further produce a limited optical limiting effect on the resonant light L2, and the full width at half maximum of the resonant light L2 on the spectrum is further narrowed.

Specifically, referring to FIG. 1B, the widths $W_n$ and the lattice constants $A_n$ of the semiconductor rod structures 112 are increased linearly from the center of the row arranged by the semiconductor rod structures 112 to the both sides of the row. Specifically, the linear increase follows the following correlation:

$$W_{n+1}=W_n+x \quad (1)$$

$$A_{n+1}=A_n+y \quad (2)$$

wherein $W_{n+1}$ represents the width of the (n+1)-th semiconductor rod structure 112 counted from the center to the both sides. In addition, $A_{n+1}$ represents the lattice constant of the (n+1)-th semiconductor rod structure 112 counted from the center to the both sides.

In the embodiment, x is 10 nm, for example, and y is also 10 nm, for example. However, in some embodiments, the x and y can be less than 10 nm, to increase the light limiting ability of the resonant structure 110, or, the x and y can also be greater than 10 nm, to decrease the manufacturing difficulty, the invention is not limited thereto.

In addition, in the above-mentioned embodiment, the cladding body 120 completely covers the semiconductor rod structures 112 of the resonant structure 110, so that the cladding body 120 and the semiconductor rod structures 112 form a symmetrical structure on all three directions along each dimension (the direction of the first axis X, the direction of the second axis Y, and the direction of the third axis Z, for example), and the symmetrical structure can achieve the symmetry distribution resonance mode, which has lower optical loss. However, in some embodiments, the cladding body 120 can also selectively not cover the semiconductor rod structures 112. In these embodiments, the cladding body 120 and the semiconductor rod structures 112 therein have an asymmetry distribution resonance mode. In addition, because the semiconductor rod structures 112 of the embodiments are partially exposed in the air, the thermal conductivity thereof is poorer, and because the semiconductor rod structures 112 are not completely covered by the cladding body 120, when a deformation corresponding to the external force is occurred on the cladding body 120, the semiconductor rod structures 112 may be detached.

In the above-mentioned embodiment, when an external force is applied on the cladding body 120, the cladding body 120 is configured to drive the semiconductor rod structures 112 to produce a deformation corresponding to the external force, wherein the deformation includes stretching, compression or twist. The cladding body 120 is, for example, a polymer material able to produce a deformation corresponding to the external force, and transparent to the wavelength of the resonant light L2, so as to avoid the optical loss due to the absorption of the material; furthermore, the cladding body has a low optical refractive index, therefore a refractive index difference between the cladding body 120 and the semiconductor rod structures 112 is large enough, so as to reduce the optical loss of the optical nanocavity in the direction other than the photonic band gap and the mode band gap. Specifically, the refractive index of the cladding body 120 is equal to or less than 2, for example, equal to or less than 1.6, preferably. For example, the material of the cladding body 120 includes polydimethylsiloxane (PDMS), but the invention is not limited thereto.

In the embodiment, the production method of the light source can be provided through the utilization of the photoluminescence semiconductor material as the semiconductor rod structures 112, so that the optical structure forms a nano-laser device through the above-mentioned resonant process; the semiconductor materials are semiconductor materials with direct bandgap, for example, or epitaxial structure having quantum confinement structure. For example, the material of the semiconductor rod structures 112 is material having quantum well or quantum dot structure, the invention is not limited thereto.

FIG. 2A to FIG. 2F illustrates the production flow chart of the optical device in the embodiment of FIG. 1A. Referring to FIG. 2A, a semiconductor wafer 20 is prepared. The semiconductor wafer 20 includes a semiconductor substrate 201 and an epitaxial layer 202, wherein the epitaxial layer 202 includes a photoluminescence or non-photoluminescence semiconductor material, and the epitaxial layer 202 is formed on the semiconductor substrate 201. Then, a first mask layer 203 and a second mask layer 204 are sequentially formed on the epitaxial layer 202. Then, referring to FIG. 2B, the lithography is used to define the semiconductor rod structure complementary pattern 205 on the second mask layer 204, then, the development and fixing are performed, the lithography mentioned herein is referred to as the one able to achieve the sub-wavelength resolution, such as electron beam lithography, deep ultraviolet (DUV), or extreme Ultraviolet (EUV) optical lithography. Afterward, the dry etching process is used to transfer the semiconductor rod structure complementary pattern 205 to the first mask layer 203, and remove the remaining second mask layer 204 simultaneously. Referring to FIG. 2C, then, the dry etching process is used to transfer the semiconductor rod structure complementary pattern 205 on first mask layer 203 to the epitaxial layer 202, so as to form the semiconductor rod structures 112. Afterward, the first mask layer 203 remained on the semiconductor rod structures 112 is removed by the chemical etching method.

Then, referring to FIG. 2D, a polymer substrate 21 able to produce a deformation corresponding to the external force is provided, and a layer of unhardened polymer material adhesive layer 211 is spin coated on the surface of the polymer substrate 21 and the surface of the semiconductor wafer 20 (that is, a portion of the surface of the semiconductor substrate 201 and the surface of the semiconductor rod structures 112) respectively. Afterward, the polymer substrate 21 and the semiconductor wafer 20 are placed in a negative pressure environment for half an hour, bonded together, and baked for 12 hours under 60° C. At this time, the polymer substrate 21 and the polymer material adhesive layer 211 form into a hardened polymer cladding layer 212 (as illustrated in FIG. 2E). Then, referring to FIG. 2E and FIG. 2F, under room temperature, the chemical selective wet etching is used to remove the semiconductor substrate 201. In addition, another layer of unhardened polymer cladding layer 213 is spin coated on the surface of the semiconductor rod structures 112 and the surface of the polymer cladding layer 212, to completely cover the semiconductor rod structures 112. Then, a baking under 60° C. is performed for 12 hours, to form a hardened cladding body 120.

Figure 3A:
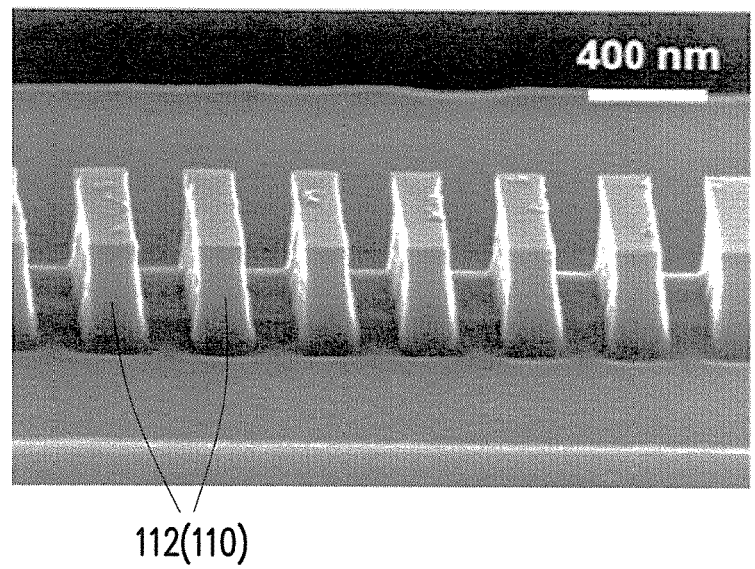
FIG. 3A is an electron microscopy image of the semiconductor rod structures not being covered by the cladding body yet in the optical device of an embodiment of the invention.
Figure 3B:
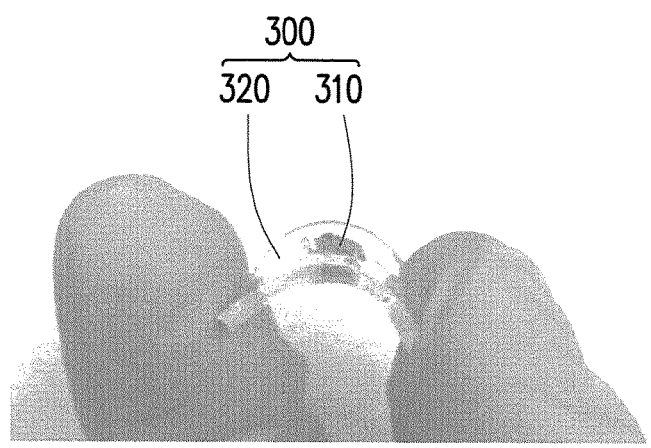
FIG. 3B illustrates the optical device in the embodiment of FIG. 3A being able to receive an external force to produce a deformation.

FIG. 3A illustrates the electron microscopy image of the semiconductor rod structures not being covered in the cladding body yet in the optical device of an embodiment of the present invention, and FIG. 3B illustrates the optical device in the embodiment of FIG. 3A being able to receive an external force to produce a deformation. In the embodiment, the optical device 300 is similar to the optical device 100 in the embodiments of FIG. 1A to FIG. 1B, the elements and related descriptions can be referred to the optical device 100 in the embodiments of FIG. 1A to FIG. 1B, and will not be repeated herein. In the embodiment, the optical device 300 includes a resonant structure 310 and a cladding body 320, and the cladding body 320 totally covers the resonant structure 310. In addition, referring to FIG. 3B, when an external force (such as the bending, stretching and compression forces provided by the fingers) is applied on the cladding body 320, a deformation corresponding to the external force is occurred on the cladding body 320 and the semiconductor rod structures (not shown) of the resonant structure 310.

Figure 3C:
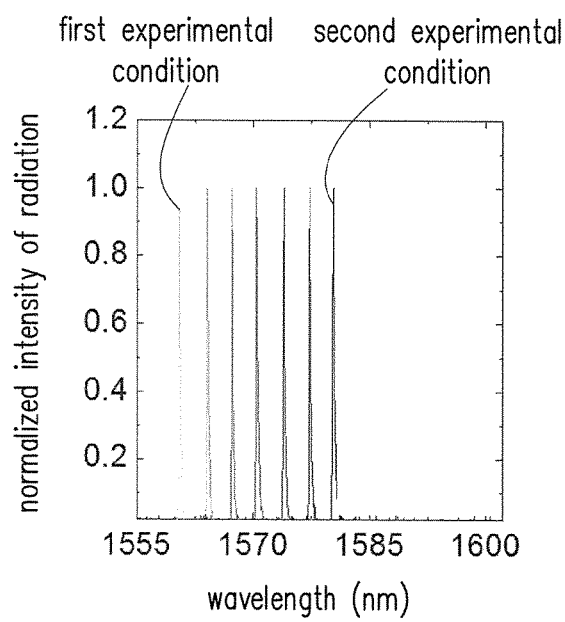
FIG. 3C illustrates a diagram of the normalized intensity of laser radiation versus wavelength under different stretching amount when the optical structure in the embodiment of FIG. 1A is configured to be a nano-laser device.

FIG. 3C illustrates a diagram of the normalized intensity of laser radiation versus wavelength under different stretching amount when the optical structure in the embodiment of FIG. 1A is configured to be a nano-laser device. Referring to FIG. 3C, in FIG. 3C, the "wavelength" on the horizontal axis represents the wavelength of the resonant light L2, and the "normalized intensity of laser radiation" on the vertical axis represents the normalized value of the light intensity of the resonant light L2 of the laser component.

In the embodiment, the structure change of the optical device 100 is driven by the stretching of the cladding body 120 caused by an external force along the direction of the first axis X, and the external force is provided when the laser of the resonant light L2 is provided by the optical device 100. In FIG. 3C, "first experimental condition" represents the diagram of the normalized intensity of laser radiation of the resonant light L2 versus wavelength when the stretching amount of the cladding body 120 caused by the external force is 0 (that is, the stretching is not performed), and "second experimental condition" represents the diagram of the normalized intensity of laser radiation of the resonant light L2 versus wavelength when the stretching amount of the cladding body 120 is 2.6%. The stretching amount mentioned herein is defined by the value change of the length when the optical device 100 or the cladding body 120 is stretched by the external force. In addition, the diagrams of the normalized intensity of laser radiation of the resonant light L2 versus wavelength under other experimental conditions are also included between the "first experimental condition" and the "second experimental condition". The experimental conditions are referred to the stretching amount between 0 and 2.6%.

Figure 3D:
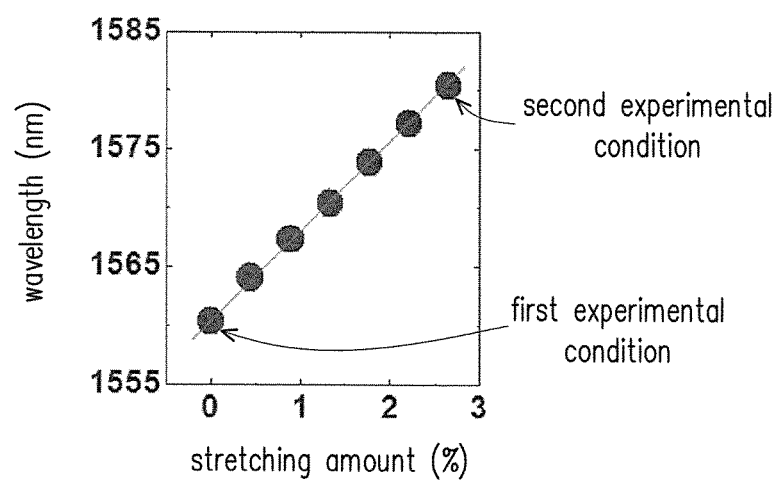
FIG. 3D illustrates a diagram of the wavelength of the laser light of the optical device in the embodiment of FIG. 1A versus the stretching amount.

In the embodiment, a deformation corresponding to the external force is occurred on the cladding body 120 and the semiconductor rod structures (not shown), so that the lattice constants of the semiconductor rod structures are changed, and the wavelength of the resonant light L2 is adjusted according to the change of the lattice constants. Specifically, in the process that the stretching amount of the cladding body 120 is increased from 0 to 2.6%, the lattice constants are increased gradually, so that the emission spectrum of the optical device 100 is red shifted linearly. For example, compared to the emission spectrum of the "first experimental condition", the emission spectrum of the "second experimental condition" has the red shift phenomenon more obviously. Referring to FIG. 3D, the "stretching amount" on the horizontal axis represents the stretching amount of the length along the direction AD after the cladding body 120 of the optical device 100 receives the external force. In addition, the "wavelength" on the vertical axis represents the wavelength of the resonant light L2. In the embodiment, when the cladding body 120 of the optical device 100 receives the external force and has 1% stretching amount, the radiation wavelength can red shift 7.65 nm, for example.

In the embodiment, a deformation corresponding to the external force can occur on the cladding body 120 and the semiconductor rod structures (not shown) through the application of the external force to the optical device 100. By doing so, the structure of the resonant structure 110 of the optical device 100 is adjusted due to the external force, and the adjustment of the wavelength of the resonant light L2 can be shown. In addition, when the external force is removed, the resonant structure 110 of the optical device 100 can get back to the state before the application of the external force, so that the wavelength of the resonant light L2 is adjusted back to the state before the application of the external force.

In the embodiment, the wavelength of the resonant light L2 can be adjusted through the stretching of the external force on the cladding body 120 along the direction of the first axis X, and wavelength adjusting range under different communication wavelength range can be completely or partially covered, including S, S+C+L, and C+L communication frequency band.

Figure 4:
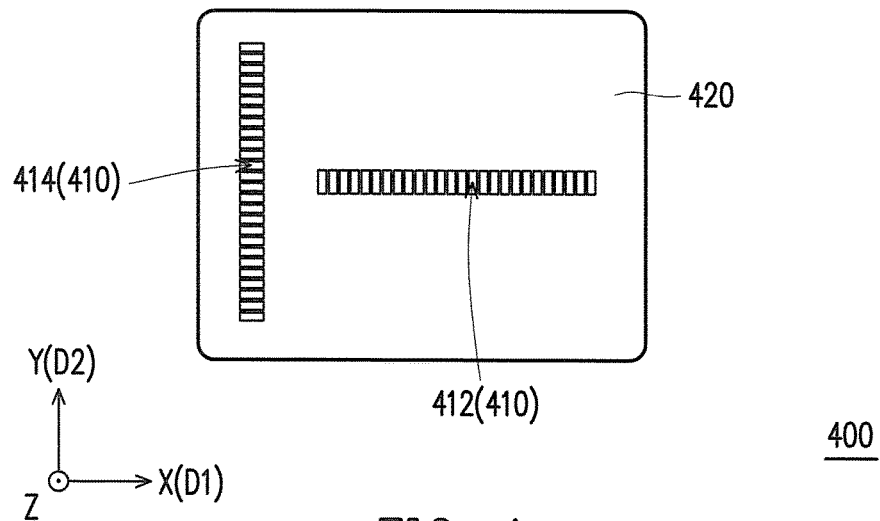
FIG. 4 is a top schematic view of the optical device in another embodiment of the present invention.

FIG. 4 is a top schematic view of the optical device in another embodiment of the present invention. Referring to FIG. 4, the optical device 400 in the embodiment of FIG. 4 is similar to the optical device 100 in the embodiments of FIG. 1A to FIG. 1B, the elements and related descriptions can be referred to the optical device 100 in the embodiments of FIG. 1A to FIG. 1B, and will not be repeated herein. The difference between the optical device 400 and the optical device 100 are described as follows. In the embodiment, except for being configured as the wavelength adjustable laser device, the optical device 400 can also be configured as an active structural mechanic tensile sensor. Specifically, the number of the at least one resonant structures 410 of the optical device 400 is 2, and the resonant structures 410 includes a first resonant structure 412 and a second resonant structure 414. The semiconductor rod structures of the first resonant structure 412 are arranged along the first direction D1, and the semiconductor rod structures of the second resonant structure 414 are arranged along the second direction D2 perpendicular to the first direction D1. In addition, in the embodiment, the first direction D1 is parallel to the direction of the first axis X, for example. And the second direction D2 is parallel to the direction of the second axis Y, for example. In addition, the cladding body 420 of the optical device 400 completely covers the semiconductor rod structures of the resonant structures 410. Furthermore, the optical device 400 further includes a detector (not shown) and a processor (not shown) coupled to the detector. The detector receives the resonant light from the first resonant structure 412 to produce the first spectral signal, and the detector receives the resonant light from the second resonant structure 414 to produce second spectral signal. When an external force is applied on the cladding body 420, a deformation is occurred on the cladding body 420 and the semiconductor rod structures of the resonant structures 410, and the processor calculates the deformation value of the deformation according to the first spectral signal and the second spectral signal.

In the embodiment, the optical device 400 can be applied in the strain sensing of the environmental mechanics, for example. The minimum detectable stretching amount $\Delta S_{det}$ of the environmental mechanical strain sensing device microchips can be described by $\Delta S_{det}=R_S/\delta\lambda$, wherein $R_S$ represents the nanocavity wavelength response under 1% stretching amount, and $\delta\lambda$ represents the minimum reliable resolution of the resonant mode on the spectrum, that is, the full width at half maximum of the radiation signal of the optical device 400. For example, in the embodiment of FIG. 1A, when the cladding body 120 of the optical device 100 receives stretching amount of 1%, the radiation wavelength can red shift 7.65 nm, for example, and the $R_S$ is 7.65 nm/%. In addition, $\delta\lambda$ is the wavelength uncertainty measured by performing repeating test on the optical device 100. For example, the wavelength uncertainty of the optical device 100 in the embodiment of FIG. 1A is 0.55 nm. In the embodiment, when the optical device 400 is used in strain sensing, the minimum detectable stretching amount $\Delta S_{det}$ can be calculated through the nanocavity wavelength response $R_S$ under 1% stretching amount and the wavelength uncertainty $\delta\lambda$. For example, the minimum detectable stretching amount $\Delta S_{det}$ of the optical device 400 is 0.072%.

Figure 5:
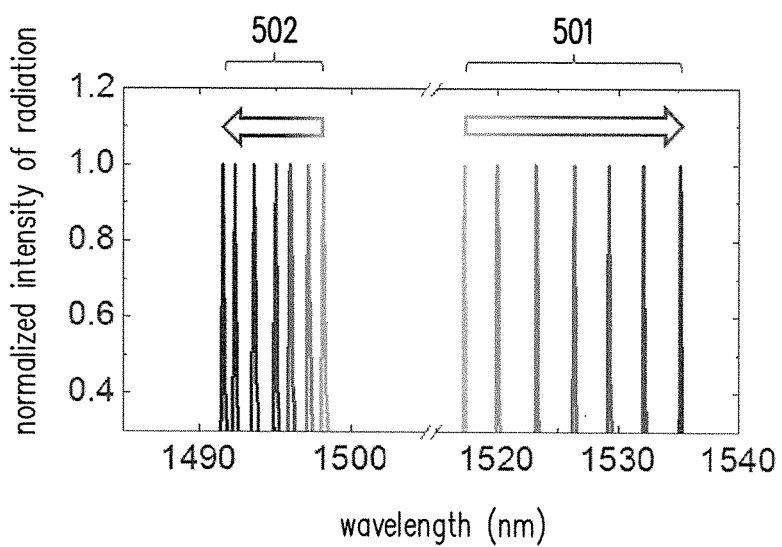
FIG. 5 is a laser differential spectrum of the optical device in the embodiment of FIG. 4 under the stretching of single direction.

FIG. 5 is a laser differential spectrum of the optical device in the embodiment of FIG. 4 under the stretching of single direction. Referring to FIG. 5, in the embodiment, the material of the cladding body 420 of the optical device 400 has a positive Poisson Ratio. When the cladding body 420 receives an external force on the direction of the first axis X to be stretched, a compression strain thereof with a ratio of about 0.33 will be produced on the direction of the second axis Y. Therefore, in the first resonant structure 412 and the second resonant structure 414 disposed in the cladding body 420, the resonant light produced thereby displays the wavelength change caused by structural stretching and compression respectively. Specifically, when the cladding body 420 receives an external force on the direction of the first axis X to be stretched, the resonant light produced by the first resonant structure 412 produces radiation wavelength red shift 501 as illustrated in FIG. 5, and the resonant light of the second resonant structure 414 produces radiation wavelength blue shift 502 as illustrated in FIG. 5. For example, under the application of 2.5% stretching amount along the direction of the first axis X on the cladding body 420 of the optical device 400, the change in the signal differential between the radiation wavelength red shift 501 and the radiation wavelength blue shift 502 reaches 24.7 nm, for example. That is, the nanocavity wavelength response $R_S$ under 1% stretching amount significantly increases to 9.9 nm/%, and the minimum detectable stretching amount $\Delta S_{det}$ decreases to 0.056%. In the embodiment, because the first resonant structure 412 and the second resonant structure 414 are perpendicular to each other, when the cladding body is stretched along a single direction, the deformation occurred thereon respectively are different, that is, each of the resonant light wavelength change trends are different, therefore, when the optical device 400 is used as a strain sensing device, a higher sensing sensitivity of the device can be achieved through signal differential.

Figure 6:
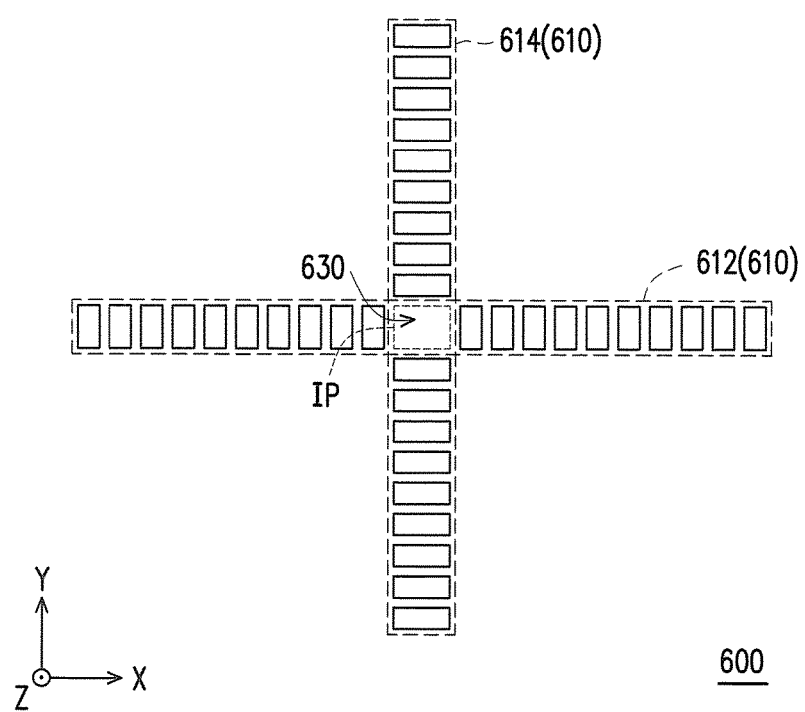
FIG. 6 is a top schematic view of the optical device in another embodiment of the present invention.

FIG. 6 is a top schematic view of the optical device in another embodiment of the present invention. The optical device 600 in the embodiment of FIG. 6 is similar to the optical device 400 in the embodiments of FIG. 4, the elements and related descriptions can be referred to the optical device 400 in the embodiment of FIG. 4, and will not be repeated herein. The difference between the optical device 600 and the optical device 400 are described as follows. In the embodiment, the optical device 600 includes a plurality of resonant structures 610, and the resonant structures 610 includes a first resonant structure 612 and a second resonant structure 614. The first resonant structure 612 and the second resonant structure 614 intersects to form the intersection position IP, and the optical device 600 further includes the common nanocavity structure 630 located on the intersection position IP. Specifically, the first resonant structure 612 and the second resonant structure 614 share the same common nanocavity structure 630, and at least 2 resonant modes having different resonant properties exist in the common nanocavity structure 630. Because when the first resonant structure 612 and the second resonant structure 614 are sharing the common nanocavity structure 630, the resonant modes thereof have extremely high single polarization property respectively (the resonant mode of the first resonant structure 612 and the second resonant structure 614 are the polarization on the direction of the second axis Y and the polarization on the direction of the first axis X respectively), therefore, the resonant modes of the two won't effect each other. Therefore, the resonant modes of the first resonant structure 612 and the second resonant structure 614 can be emitted from the same common nanocavity structure 630. In the embodiment, similar to the optical device 400 of FIG. 4, because the first resonant structure 612 and the second resonant structure 614 are perpendicular to each other, when the cladding body is stretched along a single direction, the deformation occurred thereon respectively are different, that is, each of the resonant light wavelength change trends are different, therefore, when the optical device 600 is used as a strain sensing device, a higher sensing sensitivity of the device can be achieved through signal differential. In addition, the optical device 600 has more symmetrical structure layout, so better design flexibility can be provided in the integrated optical path design. Also, the operation method of sharing single common nanocavity structure 630 to achieve single nanocavity with two modes makes the optical device 600 has the effect of lower design complexity and easy production.

Figure 7A:
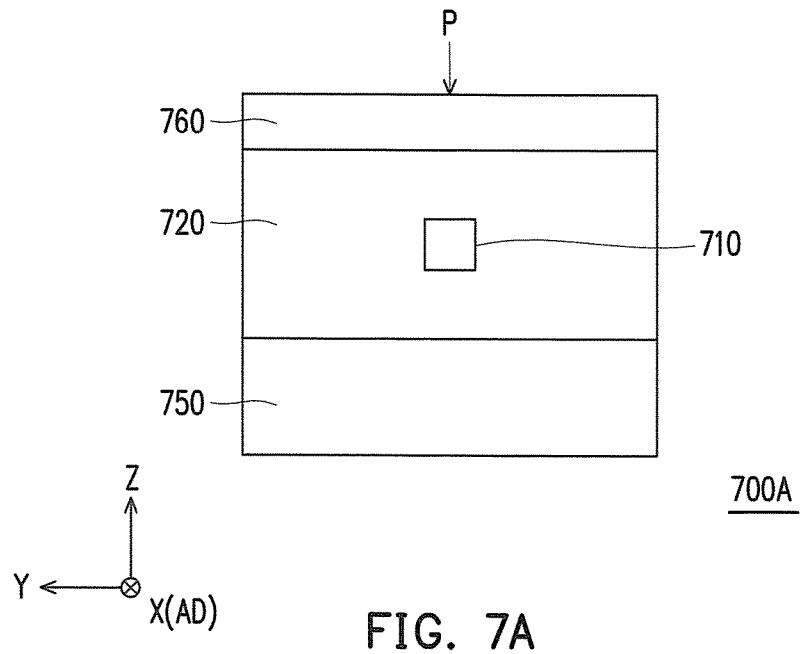
FIG. 7A is a schematic cross-sectional view of a pressure sensing device in an embodiment of the invention.
Figure 7B:
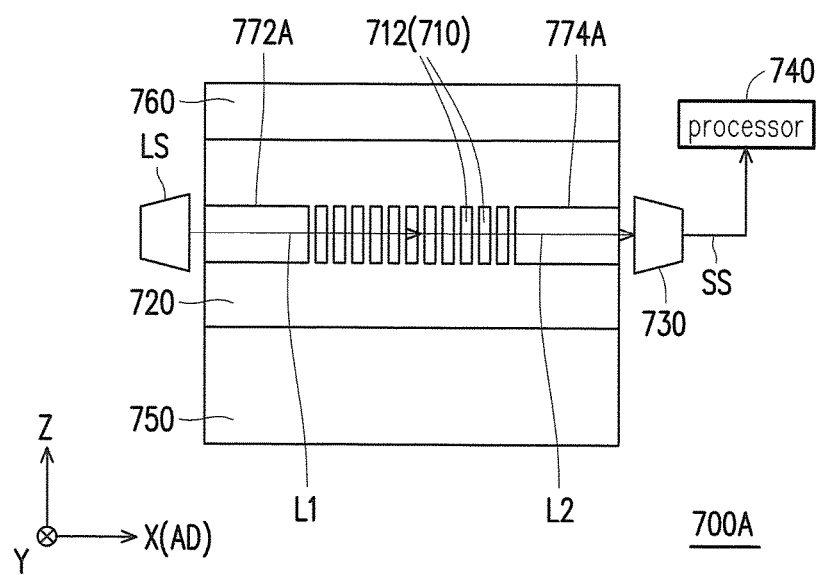
FIG. 7B is a schematic cross-sectional view of a pressure sensing device on another direction in the embodiment of FIG. 7A.

FIG. 7A is a schematic cross-sectional view of a pressure sensing device in an embodiment of the invention, and FIG. 7B is a schematic cross-sectional view of a pressure sensing device on another direction in the embodiment of FIG. 7A. Referring to FIG. 7A and FIG. 7B, in the embodiment, the pressure sensing device 700A includes a light source LS, at least one resonant structure 710 and a cladding body 720. The light source LS is configured to provide an original broadband light LI. A resonant structure 710 includes a plurality of semiconductor rod structures 712 arranged along the arranging direction AD at intervals. The original light L1 enters a resonant structure 710 and is transmitted between the semiconductor rod structures 712. In addition, the resonant structure 710 receives the original broadband light L1 to produce the resonant light L2, and the full width at half maximum of the resonant light L2 is less than the full width at half maximum of the original broadband light L1. In the embodiment, each of the semiconductor rod structures 712 has a length perpendicular to the arranging direction AD and has a width parallel to the arranging direction AD. For example, the length of each of the semiconductor rod structures 712 is parallel to the direction of the second axis Y, and the width of each of the semiconductor rod structures 712 is parallel to the direction of the first axis X, for example. Specifically, the length and width of each of the semiconductor rod structures 712 are less than the wavelength of the resonant light L2. In addition, each of the semiconductor rod structures 712 has lattice constant (not shown) on the arranging direction AD.

In the embodiment, the cladding body 720 completely covers the semiconductor rod structures 712 of the at least one resonant structure 710. When the pressure P is transmitted to the cladding body 720 through the direction perpendicular to the arranging direction AD, a deformation corresponding to the pressure P is occurred on the cladding body 720 and the semiconductor rod structures 712 on the arranging direction AD, so that the value of the widths and the lattice constants of the semiconductor rod structures 712 is changed. The wavelength of the resonant light L2 is adjusted according to the widths and the lattice constants. In addition, specifically, the pressure sensing device 700A further includes a detector 730 and a processor 740. The detector 730 receives the resonant light L2 to produce a spectral signal, and the processor 740 calculates the deformation value of the deformation according to the spectral signal. In addition, the pressure sensing device 700A further includes a first substrate 750 and a second substrate 760. The cladding body 720 and the at least one resonant structure 710 are interposed between the first substrate 750 and the second substrate 760. In the embodiment, the pressure P is applied on at least one of the first substrate 750 and the second substrate 760, and the pressure P is transmitted to the cladding body 720 along the direction perpendicular to the arranging direction AD (such as the direction of the third axis Z).

Referring to FIG. 7B, in the embodiment, the pressure sensing device 700A further includes a first light-guiding portion 772A and a second light-guiding portion 774A. The first light-guiding portion 772A and the second light-guiding portion 774A are disposed in the cladding body 720 along the arranging direction AD. The first light-guiding portion 772A is configured to guide the original broadband light L1 into a resonant structure 710, and the second light-guiding portion 774A is configured to guide the resonant light L2 into the detector 730. Specifically, the first light-guiding portion 772A, the semiconductor rod structures 712 of the resonant structure 710 and the second light-guiding portion 774A are arranged into a row along the arranging direction AD. An end of the first light-guiding portion 772A faces the light source LS, and another end of the first light-guiding portion 772A faces the semiconductor rod structures 712. An end of the second light-guiding portion 774A faces the semiconductor rod structures 712 and another end of the second light-guiding portion 774A faces the detector 730. The original light L1 enters the resonant structure 710 through coupling, and the resonant light L2 enters the second light-guiding portion 774A through coupling.

In the embodiment, the semiconductor rod structures 712 can be non-direct bandgap semiconductor material or semiconductor material without quantum structure, for example. In addition, the first light-guiding portion 772A, the semiconductor rod structures 712 and the second light-guiding portion 774A are connected into a straight line to achieve the direct coupling. Specifically, the original broadband light L1 emitted by the light source LS enters the resonant structure 710 through direct coupling, and the resonant structure 710 receives the original broadband light L1 to produce the resonant light L2. Then, the resonant light L2 is also transmitted to the second light-guiding portion 774A through direct coupling, and the resonant light L2 transmitted to the second light-guiding portion 774A is received by the detector 730.

In the embodiment, the material of the first substrate 750 and the second substrate 760 includes semiconductor material, semiconductor oxide material or material with a rigidity factor far greater than the cladding body 720, for example, the invention is not limited thereto. Specifically, the pressure P of the embodiment is applied on the second substrate 760, the first substrate 750 is configured as the support of the pressure sensing device 700B, and the thickness thereof is far greater than the thickness of the cladding body 720 and the thickness of the second substrate 760, for example, the invention is not limited thereto. In addition, the material of the second substrate 760 is material transparent to the original broadband light L1, for example. That is, when the original broadband light L1 passes the second substrate 760, the second substrate 760 doesn't absorb the original broadband light L1, or, the absorbance of the second substrate 760 toward the original broadband light L1 is ignorable. Specifically, the material of the second substrate 760 can include glass or quartz, for example, the invention is not limited thereto.

In the embodiment, the second substrate 760 is configured to sustain the pressure P on the direction of the third axis Z. The pressure P causes the cladding body 720 interposed between the first substrate 750 and the second substrate 760 to produce an expansion deformation along the direction of the first axis X and the direction of the second axis Y. The expansion deformation can cause the semiconductor rod structures 712 to produce lattice expansion, so as to change the wavelength of the resonant light L2. Specifically, the change of the wavelength of the resonant light L2 can be configured to measure the value of the pressure P. In addition, the first light-guiding portion 772A and the second light-guiding portion 774A are continuous dielectric structure with respect to the semiconductor rod structures 712. Therefore, when the cladding body 720 receives the pressure P to deform, the first light-guiding portion 772A and the second light-guiding portion 774A don't deform. That is, the guide-in efficiency and the guide-out efficiency of the optical signal at the first light-guiding portion 772A and the second light-guiding portion 774A are not affected by the application of the pressure P. In the embodiment, the detector 730 receives the resonant light L2 before and after the pressure application, so as to measure the change of the spectral signal thereof, and the processor 740 calculates the deformation value of the deformation according to the change of the spectral signal. Therefore, the value of the pressure P can be measured by the deformation value, so as to achieve the sensing of the pressure P. In the embodiment, the pressure sensing device 700A calculates the deformation corresponding to the applied pressure P according to the light after the wavelength adjustment, to achieve the pressure sensing.

Figure 7C:
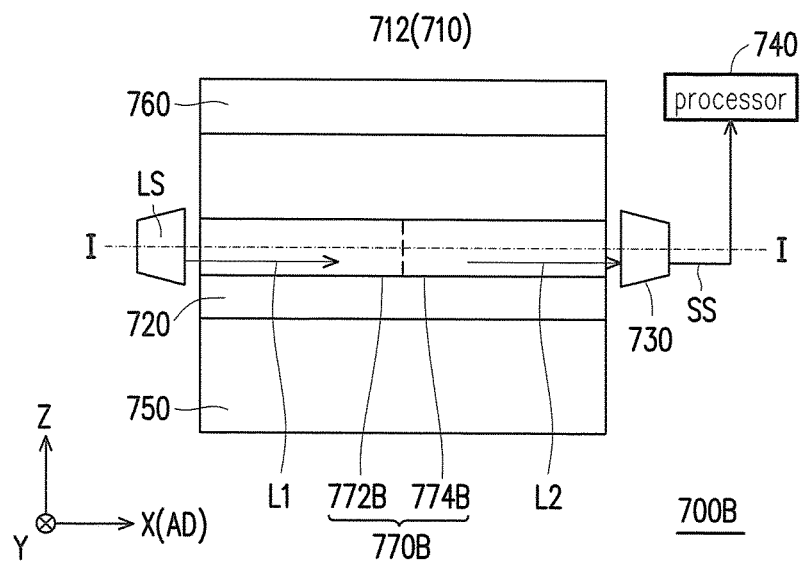
FIG. 7C is a schematic cross-sectional view of a pressure sensing device in another embodiment of the invention.
Figure 7D:
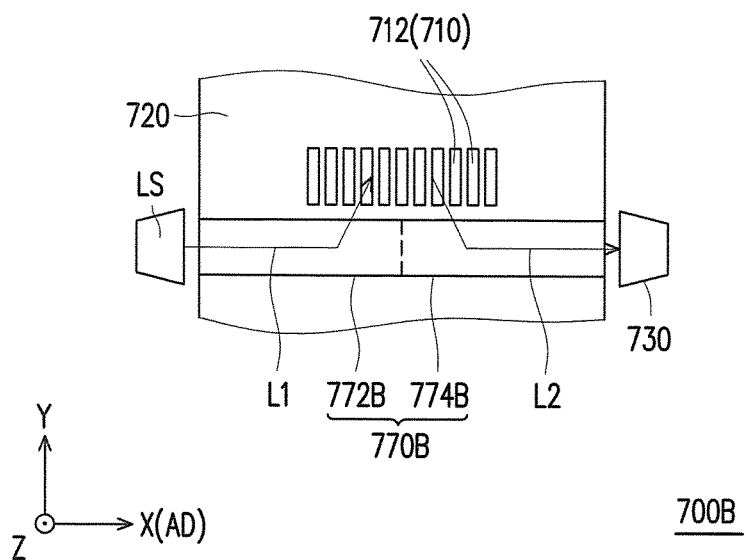
FIG. 7D is a schematic cross-sectional view of the pressure sensing device in the embodiment of FIG. 7C along line I-I.

FIG. 7C is a schematic cross-sectional view of a pressure sensing device in another embodiment of the invention, and FIG. 7D is a schematic cross-sectional view of the pressure sensing device in the embodiment of FIG. 7C along line I-I. Referring to both FIG. 7C and FIG. 7D, the pressure sensing device 700B in the embodiment of FIG. 7C is similar to the pressure sensing device 700A in the embodiments of FIG. 7A to FIG. 7B, the elements and related descriptions can be referred to the pressure sensing device 700A in the embodiments of FIG. 7A to FIG. 7B, and will not be repeated herein. The difference between the pressure sensing device 700B and the pressure sensing device 700A are described as follows. In the embodiment, the first light-guiding portion 772B and the second light-guiding portion 774B of the pressure sensing device 700B are connected to form the light-guiding structure 770B. The light-guiding structure 770B is disposed beside the semiconductor rod structures 712 of the resonant structure 710 arranged along the arranging direction AD. An end of the light-guiding structure 770B faces the light source LS and another end of the light-guiding structure 770B faces the detector 730. The original broadband light L1 of the light source LS enters the resonant structure 710 through coupling, and the resonant light L2 enters the light-guiding structure 770B through coupling. Specifically, the original broadband light L1 enters the resonant structure 710 through lateral coupling, and the resonant light L2 also enters the light-guiding structure 770B through lateral coupling. The original broadband light L1 of the present embodiment can enter the resonant structure 710 (as shown in FIG. 7D) directly in the process of lateral coupling, and don't need to pass a plurality of semiconductor rod structures 712 first as the direct coupling (positive coupling). In addition, the resonant light L2 can also directly leave the resonant structure 710 by the side in the process of lateral coupling. Therefore, the light energy consumption of the pressure sensing device 700B in the embodiment is lower, the light coupling efficiency thereof is better.

Figure 7E:
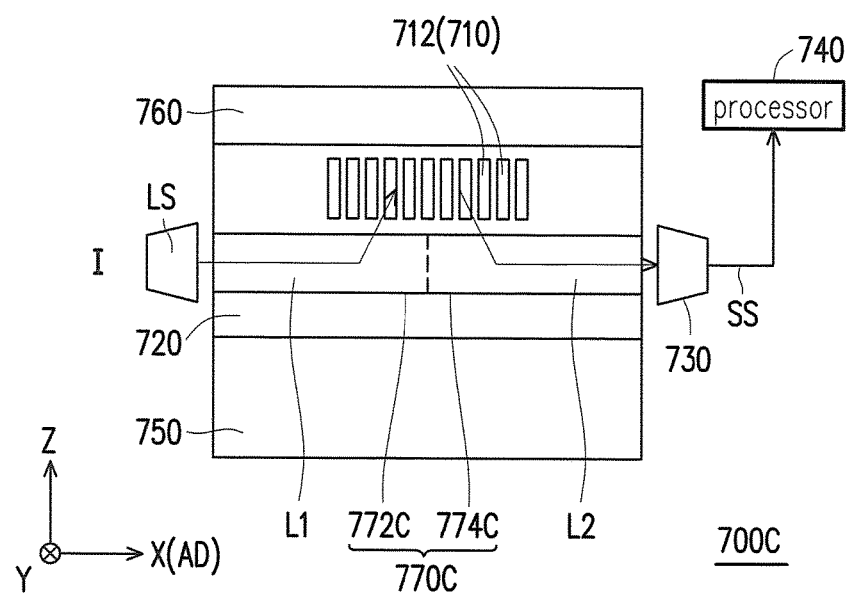
FIG. 7E is a schematic cross-sectional view of a pressure sensing device in another embodiment of the invention.

FIG. 7E is a schematic cross-sectional view of a pressure sensing device in another embodiment of the invention. Referring to FIG. 7E, the pressure sensing device 700C in the embodiment of FIG. 7E is similar to the pressure sensing device 700B in the embodiments of FIG. 7C, the elements and related descriptions can be referred to the pressure sensing device 700B in the embodiments of FIG. 7C, and will not be repeated herein. The difference between the pressure sensing device 700C and the pressure sensing device 700B are described as follows. In the embodiment, the first light-guiding portion 772C and the second light-guiding portion 774C of the pressure sensing device 700C are connected to form the light-guiding structure 770C. The light-guiding structure 770C is disposed beside the semiconductor rod structures 712 of the resonant structure 710 arranged along the arranging direction AD. Different from the above-mentioned pressure sensing device 700B, the light-guiding structure 770C and the resonant structure 710 in the embodiment locate on different XY plane (that is, locate on different position on the direction of the third axis Z). That is, the line layout of the pressure sensing device 700C is not limited on the two-dimensional plane, and can be expanded to the three-dimensional line layout. Compared to the pressure sensing device 700B of the above-mentioned embodiment, the pressure sensing device 700C of the embodiment has the effect of increasing the light density.

Figure 8A:
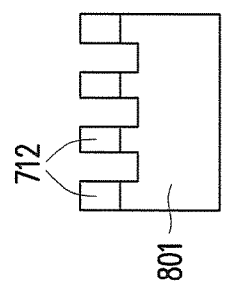
FIG. 8A to FIG. 8F illustrates the production flow chart of the pressure sensing device in the embodiment of FIG. 7A.
Figure 8B:
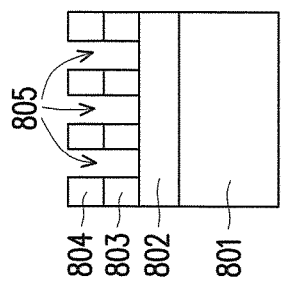
Figure 8C:

FIG. 8A to FIG. 8F illustrates the production flow chart of the pressure sensing device (pressure sensing device 700B) in the embodiment of FIG. 7A. Referring to FIG. 8A, first, a semiconductor wafer 80 is prepared, includes a semiconductor substrate 801 and an epitaxial layer 802, wherein the epitaxial layer 802 includes a non-direct bandgap or direct bandgap semiconductor material, and the epitaxial layer 802 is formed on the semiconductor substrate 801. Then, a first mask layer 803 and a second mask layer 804 are sequentially formed on the epitaxial layer 802. Then, referring to FIG. 8B, the semiconductor rod structure complementary pattern 805 is defined on the second mask layer 804 by lithography, then the development and fixing are performed. Afterward, the dry etching process is used to transfer the semiconductor rod structure complementary pattern 805 to the first mask layer 803, and remove the remaining second mask layer 804 simultaneously. Referring to FIG. 8C, the dry etching process is used to transfer the semiconductor rod structure complementary pattern 805 on first mask layer 803 to the epitaxial layer 802, so as to form the semiconductor rod structures 712. Afterward, the first mask layer 803 remained on the semiconductor rod structures 712 is removed by the chemical etching method.

Figure 8D:
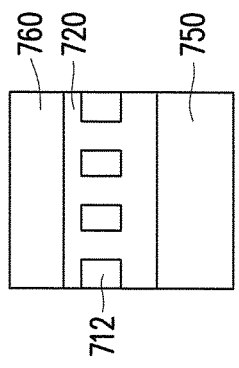
Figure 8E:
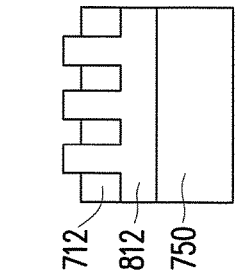
Figure 8F:
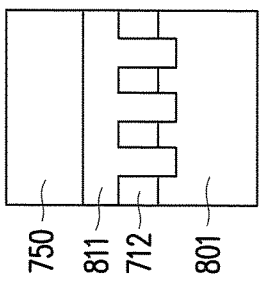

Then, referring to FIG. 8D, the first substrate 750 is provided, wherein the material of the first substrate 750 includes the semiconductor material or the semiconductor oxide material, for example. In addition, a layer of unhardened polymer material adhesive layer 811 is spin coated on the surface of the first substrate 750 and the surface of the semiconductor wafer 80 (that is, a portion of the surface of the semiconductor substrate 801 and the surface of the semiconductor rod structures 712) respectively. Afterward, the first substrate 750 and the semiconductor wafer 80 are placed in a negative pressure environment for half an hour, bonded, and baked for 12 hours under 60° C. At this time, the polymer material adhesive layer 811 form into a hardened polymer cladding layer 812 (as illustrated in FIG. 8E). Then, referring to FIG. 8E and FIG. 8F, under room temperature, the chemical selective wet etching is used to remove the semiconductor substrate 801. In addition, a layer of unhardened polymer cladding layer is spin coated on the surface of the semiconductor rod structures 712 and the surface of the polymer cladding layer 812, to completely cover the semiconductor rod structures 712. In addition, a second substrate 760 spin-coated with a layer of unhardened polymer cladding layer is provided, and the second substrate 760 and the first substrate 750 are adhered together. Then, the whole device is baked under 60° C. for 12 hours, to form a hardened cladding body 720. In addition, an appropriate light source LS is provided, so as to provide an original broadband light into the cladding body 720. In such a way, the manufacturing of the optical device of the embodiment is completed.

In addition, the pressure sensing device 700C in the embodiment of FIG. 7E can be obtained by the manufacturing flowchart similar to FIG. 8A to FIG. 8D. Specifically, first, two structures similar to the illustration in FIG. 8E is manufactured, one of them has the light-guiding structure 770C and the first substrate 750, another one has the resonant structure 710 and the second substrate 760. Then, the two structures are bonded under the observation of the optical alignment system with nanometer-micrometer scale resolution. Specifically, the optical alignment system is optical microscope, for example.

Figure 9A:
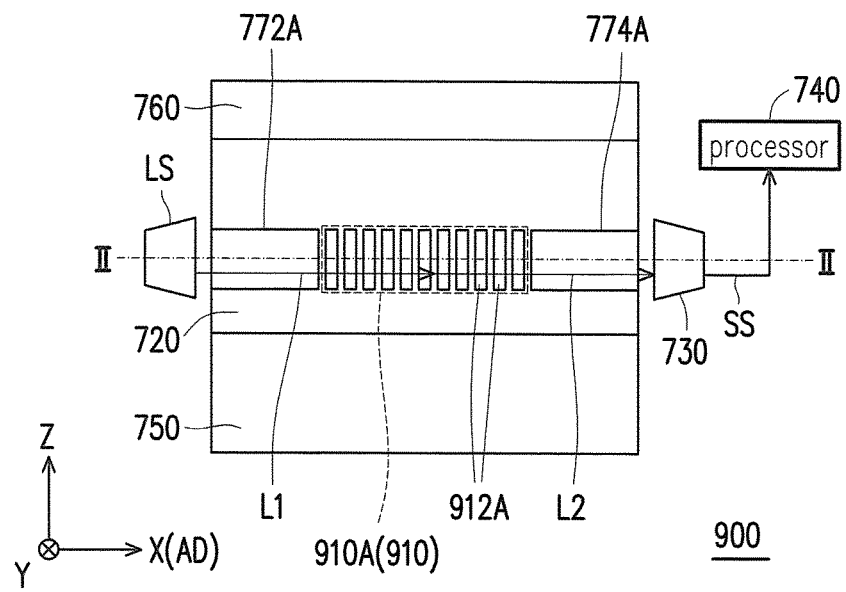
FIG. 9A is a schematic cross-sectional view of a pressure sensing device in another embodiment of the invention.
Figure 9B:
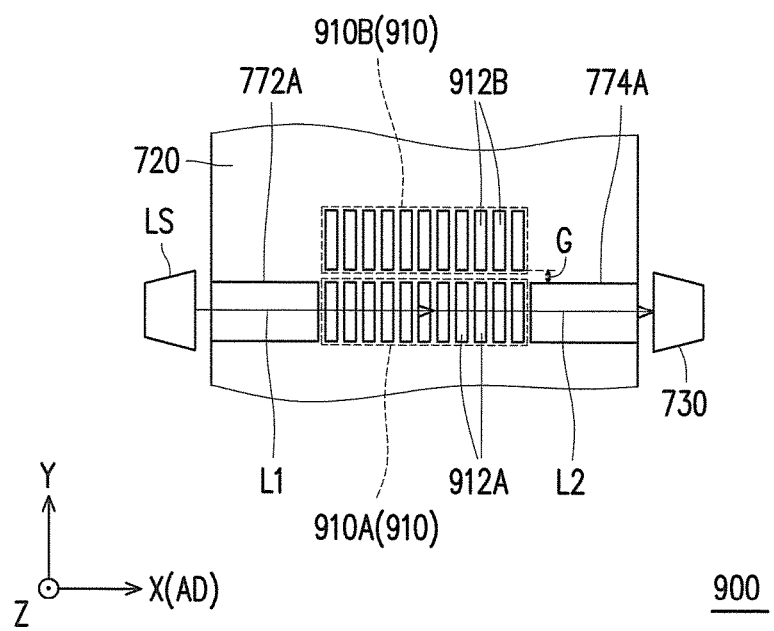
FIG. 9B is a schematic cross-sectional view of the pressure sensing device in the embodiment of FIG. 9A along line II-II.

FIG. 9A is a schematic cross-sectional view of a pressure sensing device in another embodiment of the invention, and FIG. 9B is a schematic cross-sectional view of the pressure sensing device in the embodiment of FIG. 9A along line II-II. The pressure sensing device 900 in the embodiments of FIG. 9A and FIG. 9B is similar to the pressure sensing device 700A in the embodiments of FIG. 7A to FIG. 7B, the elements and related descriptions can be referred to the pressure sensing device 700A in the embodiments of FIG. 7A to FIG. 7B, and will not be repeated herein. The difference between the pressure sensing device 900 and the pressure sensing device 700A are described as follows. In the embodiment, the number of the at least one resonant structures 910 of the pressure sensing device 900 is 2, and the resonant structures 910 includes a first resonant structure 910A and a second resonant structure 910B. The semiconductor rod structures 912A of the first resonant structure 910A are arranged into a first row, the semiconductor rod structures 912B of the second resonant structure 910B are arranged into a second row parallel and adjacent to the first row. In addition, the original broadband light L1 from the light source LS enters one of the first resonant structure 910A and the second resonant structure 910B. Specifically, the semiconductor rod structures 912A of the first row and the semiconductor rod structures 912B of the second row have the gap G on the gap direction GD perpendicular to the arranging direction AD. In the embodiment, when the pressure P is transmitted to the cladding body 720 perpendicularly with respect to the arranging direction AD, the lattice constant expansion along the arranging direction AD and the increase of the gap G along the gap direction GD are occurred on the semiconductor rod structures 912A, 912B of the resonant structures 910 and the cladding body 720, and the wavelength of the resonant light L2 is changed according to the increase of the lattice constant and the gap G.

Figure 10:
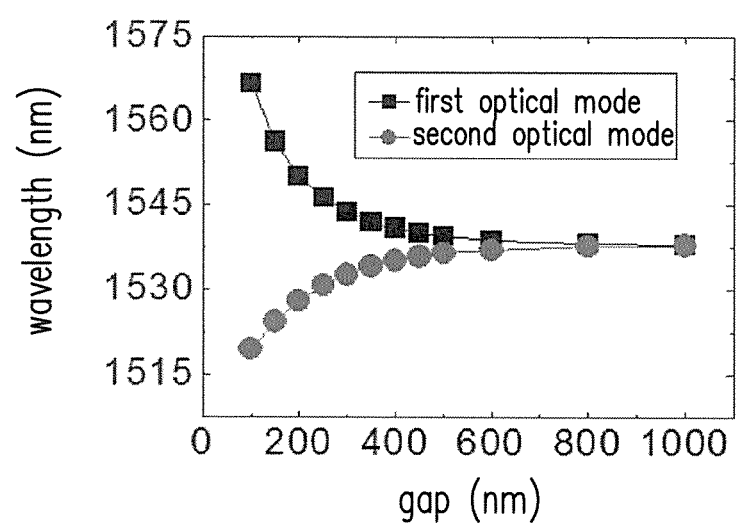
FIG. 10 illustrates a diagram of the laser light wavelength of the two optical modes of the pressure sensing device in the embodiment of FIG. 9A versus the coupling gap.

FIG. 10 illustrates a diagram of the laser light wavelength of the two optical modes of the pressure sensing device in the embodiment of FIG. 9A versus the coupling gap. Referring to FIG. 10, specifically, the two nanocavity system can be compared to a diatomic system, wherein the two optical modes of the two resonant structures 910A and 910B can be compared to the energy state of bonding, anti-bonding in the diatomic system. The first resonant structure 910A and the second resonant structure 910B in the embodiment of FIG. 9A form into an optical analogy structure of diatomic structure, for example, and the structure forms a coupling nanocavity, and coupling-split into the mode similar to the bonding and anti-bonding optical coupling resonant mode in the diatomic system from the original mode of the single nanocavity. In the embodiment, the two modes have a high energy level (short wavelength) and a low energy level (long wavelength) respectively. When the gap G between the semiconductor rod structures 912A of the first row and the semiconductor rod structures 912B of the second row is changed, their optical coupling resonance mode wavelength thereof corresponding to the first resonant structure 910A and the second resonant structure 910B also changes accordingly.

In FIG. 10, the vertical axis represents the wavelength of the resonant light L2 of the pressure sensing device 900, the horizontal axis represents the gap G between the semiconductor rod structures 912A of the first row and the semiconductor rod structures 912B of the second row. In addition, "first optical mode" represents the diagram of the wavelength of the resonant light L2 under bonding mode versus gap G, and the "second optical mode" represents the diagram of the wavelength of the resonant light L2 under anti-bonding mode versus gap G. In the embodiment, when the gap G is far greater than the appropriate coupling distance, the first resonant structure 910A has nearly no interaction with the second resonant structure 910B, that is, the coupling is not occurred. In addition, the bonding mode and the anti-bonding mode have the same resonant mode wavelength. However, with the decrease of the gap G, a difference is produced between the resonant mode wavelength of the bonding mode and the resonant mode wavelength of the anti-bonding mode. When the gap G is less than the optical near field coupling length, the coupling effect thereof becomes very significant, and an obvious difference is produced between the resonant mode wavelength of the bonding mode and the resonant mode wavelength of the anti-bonding mode. In the embodiment, the dependency between the wavelength and the gap G can be applied in the measuring method of the strain (pressure P) sensing, for example.

In the embodiment, when the pressure P is applied on the second substrate 760 to cause the cladding body 720 to expand along the direction of the first axis X and the direction of the second axis Y, because the lattice constants of the semiconductor rod structures 912A of the first row and the lattice constants of the semiconductor rod structures 912B of the second row are increased on the direction of the first axis X, a wavelength red shift is increased in the resonant mode wavelength of the anti-bonding mode. In addition, because the gap G on the direction of the second axis Y is increased, the coupling distance between the first resonant structure 910A and the second resonant structure 910B is increased, therefore, another wavelength red shift is increased in the resonant mode wavelength of the anti-bonding mode. Specifically, compared to the pressure sensing device 700A of FIG. 7A, the pressure sensing device 900 of the embodiment can obtain greater wavelength response under the same applied pressure, therefore, having the higher sensing response and sensitivity.

Figure 11A:
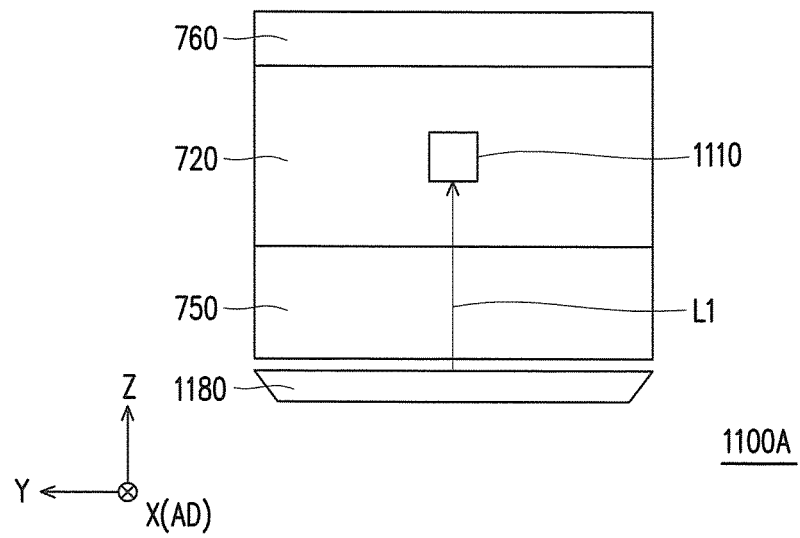
FIG. 11A is a schematic cross-sectional view of a pressure sensing device in another embodiment of the invention.
Figure 11B:
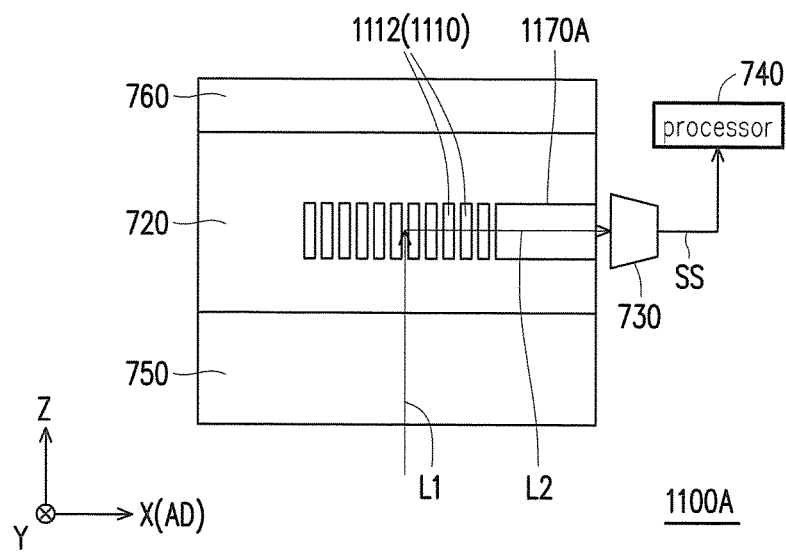
FIG. 11B is a schematic cross-sectional view of a pressure sensing device on another direction in the embodiment of FIG. 11A.

FIG. 11A is a schematic cross-sectional view of a pressure sensing device in another embodiment of the invention, and FIG. 11B is a schematic cross-sectional view of a pressure sensing device on another direction in the embodiment of FIG. 11A. Referring to FIG. 11A and FIG. 11B, the pressure sensing device 1100A in the embodiment of FIG. 11A is similar to the pressure sensing device 700A in the embodiments of FIG. 7A to FIG. 7B, the elements and related descriptions can be referred to the pressure sensing device 700A in the embodiments of FIG. 7A to FIG. 7B, and will not be repeated herein. The difference between the pressure sensing device 1100A and the pressure sensing device 700A are described as follows. In the embodiment, the light source of the pressure sensing device 1100A is back light source 1180, disposed on a side of the cladding body 720. Specifically, the back light source 1180 is disposed on a side of the first substrate 750 away from the cladding body 720, for example. In addition, the resonant structure 1110 includes a plurality of semiconductor rod structures 1112, and the material of the semiconductor rod structures 1112 includes semiconductor material having direct bandgap, or material having quantum structure, the back light source 1180 is configured to excite the resonant structure 1110 to produce an original broadband light L1. In an embodiment, the pressure sensing device 1100A further includes a light-guiding structure 1170A disposed in the cladding body 720. The semiconductor rod structures 1112 of the resonant structure 1110 and the light-guiding structure 1170A are arranged into a row on the same XY plane (for example, the plane formed by the first axis X and the second axis Y) along the arranging direction AD. In addition, an end of the light-guiding structure 1170A faces the semiconductor rod structures 1112 and another end of the light-guiding structure 1170A faces the detector 730. The light-guiding structure 1170A is configured to guide the resonant light into the detector. Specifically, the semiconductor rod structures 1112 and the light-guiding structure 1170A are connected into a straight line to achieve the direct coupling, and the resonant light L2 produced by the production of the original broadband light L1 from the resonant structure 1110 enters the light-guiding structure 1170A through coupling. Then, the resonant light L2 transmitted to the light-guiding structure 1170A is received by the detector 730. In the embodiment, the resonant structure 1110 and the light-guiding structure 1170A can also be disposed as the illustration in FIG. 7E, on the different XY plane (that is, on the different position along the direction of the third axis X).

In the embodiment, the material of the semiconductor rod structures 1112 includes the semiconductor material having direct bandgap or material having quantum structure, the back light source 1180 can excite the resonant structure 1110 to produce an original broadband light L1, effectively resonating in the resonant structure 1110 to produce the resonant light L2. Therefore, the first light-guiding portion 772A in the embodiment of FIG. 7A to FIG. 7B doesn't have to be disposed in the pressure sensing device 1100A necessarily to coupling-enter the original broadband light L1 into the resonant structure 1110, so that the pressure sensing device 1100A has more simplified device structure. Compared to the pressure sensing device 700A in the embodiments of FIG. 7A to FIG. 7B, the pressure sensing device 1100A has simpler line layout and lower original broadband light precision preset requirements.

Figure 11C:
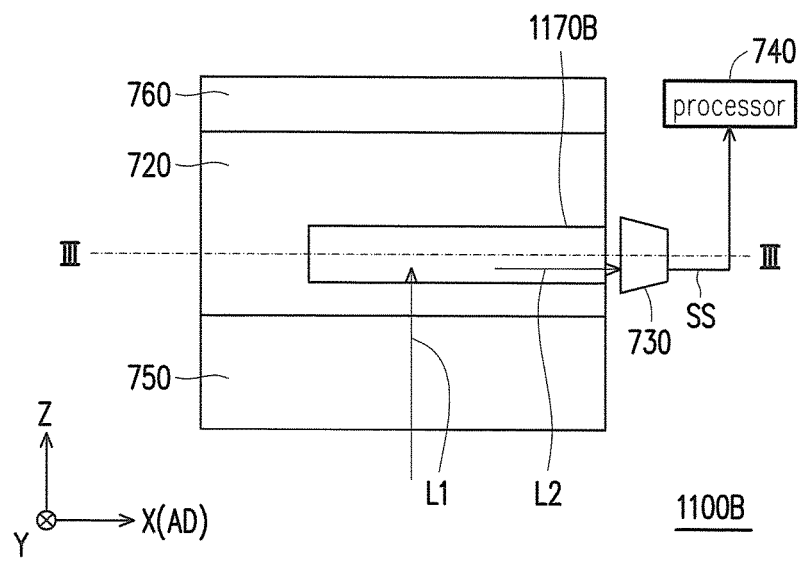
FIG. 11C is a schematic cross-sectional view of a pressure sensing device in another embodiment of the invention.
Figure 11D:
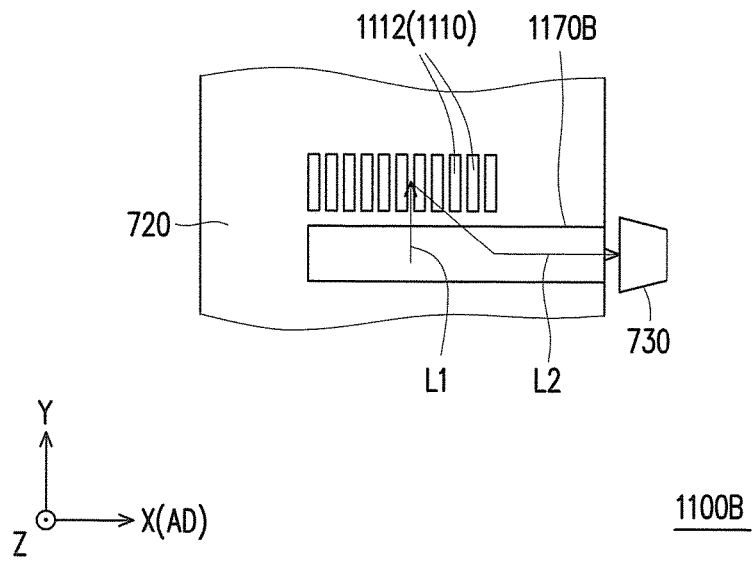
FIG. 11D is a schematic cross-sectional view of the pressure sensing device in the embodiment of FIG. 11C along line III-III.

FIG. 11C is a schematic cross-sectional view of a pressure sensing device in another embodiment of the invention, and FIG. 11D is a schematic cross-sectional view of the pressure sensing device in the embodiment of FIG. 11C along line III-III. Referring to both FIG. 11C and FIG. 11D, the pressure sensing device 1100B in the embodiments of FIG. 11C and FIG. 11D is similar to the pressure sensing device 1100A in the embodiments of FIG. 11A and FIG. 11B, the elements and related descriptions can be referred to the pressure sensing device 1100A in the embodiments of FIG. 11A and FIG. 11B, and will not be repeated herein. The difference between the pressure sensing device 1100B and the pressure sensing device 1100A are described as follows. In the embodiment, the light-guiding structure 1170B of the pressure sensing device 1100B is disposed beside the semiconductor rod structures 1112 of the resonant structure 1110 arranged along the arranging direction AD, and an end of the light-guiding structure 1170B faces the detector 730. The resonant light L2 enters the light-guiding structure 1170B through a lateral coupling, and the light-guiding structure 1170B is configured to guide the resonant light L2 into the detector 730. Specifically, the resonant light L2 of the embodiment can directly leave the resonant structure 1110 by the side through the lateral coupling. Therefore, the optical loss of the pressure sensing device 1100B in the embodiment is lower, the light coupling efficiency thereof is better.

Figure 12:
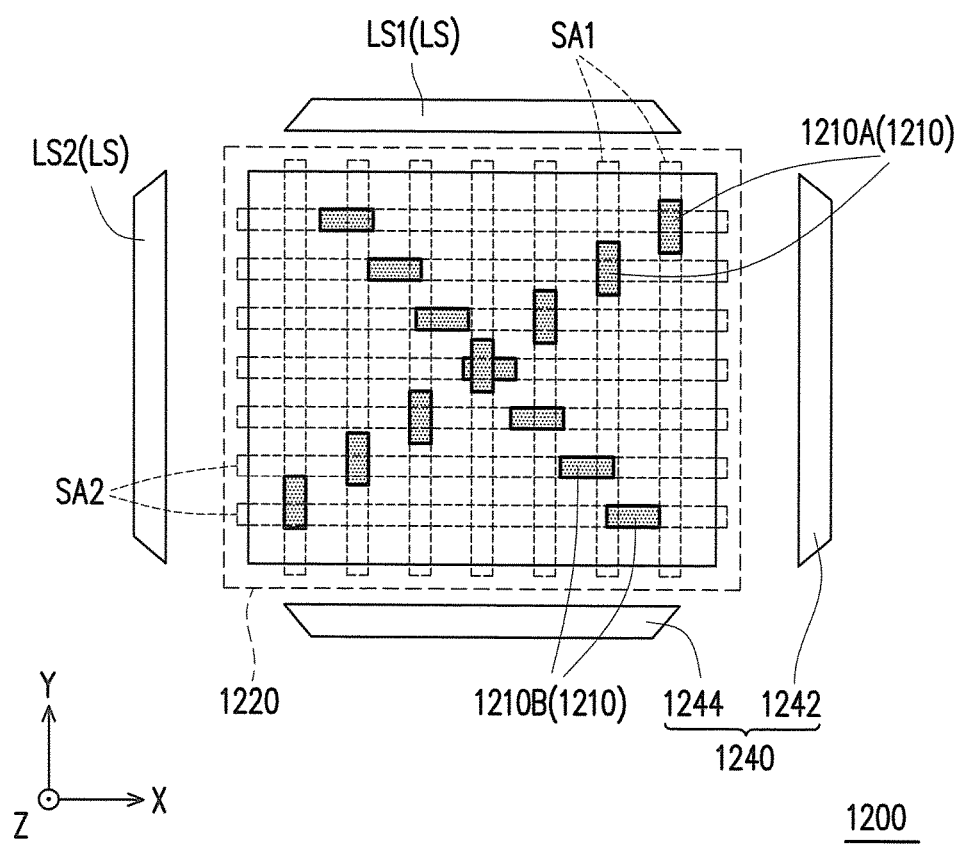
FIG. 12 is a schematic top view of a pressure sensing apparatus in an embodiment of the invention.

FIG. 12 is a schematic top view of a pressure sensing apparatus in an embodiment of the invention. Referring to FIG. 12, in the embodiment, the pressure sensing apparatus 1200 includes a plurality of first sensing units SA1 arranged periodically along the direction of the first axis X and a plurality of second sensing units SA2 arranged periodically along the direction of the second axis Y. Each of the first sensing units SA1 and the second sensing units SA2 includes a resonant structure 1210 and a light-guiding structure, for example. The resonant structures 1210 include a plurality of resonant structures 1210A located on the first sensing unit SA1 and a plurality of resonant structures 1210B located on the second sensing units SA2. In addition, the resonant structures 1210 and the light-guiding structures can be chosen from the resonant structures and the light-guiding structures of the above-mentioned embodiments, or the resonant structures and the light-guiding structures of other types. Specifically, each of the first sensing units SA1 and the second sensing units SA2 includes the first light-guiding portion 772A, the resonant structure 710 and the second light-guiding portion 774A in the embodiments of FIG. 7A to FIG. 7B, for example, or the light-guiding structure 770B and the resonant structure 710 in the embodiments of FIG. 7C, or the first light-guiding portion 772A, the resonant structure 910 and the second light-guiding portion 774A in the embodiments of FIG. 9, or the resonant structure 1110 and the light-guiding structure 1170A in the embodiments of FIG. 11A to FIG. 11B, or the resonant structure 1110 and the light-guiding structure 1170B in the embodiments of FIG. 11C. Or, in some embodiments, according to the practical design requirements, each of the first sensing units SA1 and the second sensing units SA2 includes the combination of the resonant structure and the light-guiding structure (the first light-guiding portion, the second light-guiding portion) in the embodiments of FIG. 7A to FIG. 7B, FIG. 7C to FIG. 7D, FIG. 7E, FIG. 9A to FIG. 9B, FIG. 11A to FIG. 11B and FIG. 11C, for example, the invention is not limited thereto.

In the embodiment, at least part of the first sensing units SA1 and at least part of the second sensing units SA2 locate on different location along the direction of the third axis Z in the cladding body 1220, that is, locate on different XY plane. Specifically, the cladding body 1220 completely covers the semiconductor rod structures of the resonant structures 1210. The resonant structures 1210A of the first sensing units SA1 are arranged along the first direction (such as the oblique arrangement of the resonant structures 1210A in FIG. 12), and the resonant structures 1210B of the second sensing units SA2 are arranged along the second direction different from the first direction (such as the oblique arrangement of the resonant structures 1210B in FIG. 12). In addition, the semiconductor rod structures of each resonant structure 1210A are arranged along the direction of the second axis Y at intervals, for example, and the semiconductor rod structures of each resonant structure 1210B are arranged along the direction of the first axis X at intervals, for example, the invention is not limited thereto.

In the embodiment, when the pressure is transmitted to the cladding body 1220 through the direction perpendicular to the arranging direction of the semiconductor rod structures of the resonant structures 1210, a deformation corresponding to the pressure is occurred on the semiconductor rod structures of the resonant structures 1210 and the cladding body 1220 along the arranging direction thereof. Therefore, the size or/and gap G (such as the gap G of FIG. 9B) of the lattice constants of the semiconductor rod structures are changed. At least part of the resonant structures 1210 receives the original broadband light (not shown) emitted by the light source LS to produce the resonant light (not shown), and the wavelength of the resonant light is changed according to the change of the lattice constants or/and the gap G.

Specifically, the semiconductor rod structures of the resonant structures 1210 locate on different regions of the plane formed by the direction of the first axis X and direction of the second axis Y, so as to measure of received force on different regions on the plane. In the embodiment, the light source LS of the pressure sensing apparatus 1200 includes the first light source LS1 and the second light source LS2, and the first light source LS1 and the second light source LS2 are multi-output light source device, for example. The first light source LS1 is configured to provide the original broadband light into the resonant structures 1210A of the first sensing units SA1, and the second light source LS2 is configured to provide the original broadband light to the resonant structures 1210B of the second sensing units SA2.

In some embodiments, the light source of the pressure sensing apparatus 1200 is back light source, disposed on a side of the cladding body 1220. Specifically, the back light source of the embodiments is located on a side of the cladding body 1220 along the direction of the third axis Z, for example, and the back light source is configured to excite the resonant structures 1210 of the first sensing units SA1 and the second sensing units SA2 to produce the original broadband light.

In addition, in the embodiment, the pressure sensing apparatus 1200 further includes a detector (not shown) and a processor 1240. The detector receives the resonant light produced by at least part of the resonant structures 1210 respectively to produce a plurality of spectral signals, and the processor 1240 calculates the occurring location of the deformation produced correspondingly to the applied pressure and the deformation value of the deformation according to the spectral signal changes, so as to measure the location, value of the applied pressure or other information. Specifically, the processor 1240 includes a first multiplexer 1242 and a second multiplexer 1244, the first multiplexer 1242 and the second multiplexer 1244 analyze the spectral signals from the resonant structures 1210 of the first sensing units SA1 and the second sensing units SA2 respectively, for example. However, in some embodiments, the processor 1240 can also include multiplexer of other number, or have multiplexer structure of other types, the invention is not limited thereto.

Specifically, about the components such as the light source LS, the resonant structures 1210, the cladding body 1220, the detector (not shown) and the processor 1240 of the pressure sensing apparatus 1200, enough instruction, recommendations and embodiment details can be obtained from the embodiments in FIG. 1A to FIG. 11C, and are not repeated herein. In the embodiment, the pressure sensing apparatus 1200 can calculate the deformation corresponding to the applied pressure according to the light after wavelength adjustment, to achieve the pressure sensing, and the sensing sensitivity thereof is excellent and the device footprint thereof is smaller.

Based on the above, in the optical device, the pressure sensing device and the pressure sensing apparatus of the embodiment of the invention, a resonant structure includes a plurality of semiconductor rod structures arranged into a row at intervals along the arranging direction. The light source provides the original broadband light entering the resonant structure from the outside or produced by the resonant structure, and transmitted in the semiconductor rod structures and between the semiconductor rod structures. The resonant structure receives the original broadband light to produce the resonant light, and the full width at half maximum of the resonant light is less than the full width at half maximum of the original broadband light. In addition, the cladding body completely covers the semiconductor rod structures of the resonant structures. When an external force or pressure is applied on the cladding body, a deformation corresponding to the external force is occurred on the cladding body and the semiconductor rod structures. Therefore, the deformation caused by an external force can be applied on the optical device of the embodiment of the invention, to perform the structural adjustment of the resonant structure, so that reliable and large range wavelength adjustment can be achieved. In addition, the optical device has small device footprint and the pattern is suitable for the integration of optical waveguide. Furthermore, in the pressure sensing device and the pressure sensing apparatus of the embodiment of the invention, the wavelength of the resonant light changes according to the deformation corresponding to the pressure, and the pressure sensing device and the pressure sensing apparatus sense the applied pressure according to the wavelength of the resonant light, so as to achieve the pressure sensing, and have excellent sensitivity and smaller device footprint.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pressure sensing device, comprising:
   a light source, configured to provide an original broadband light;
   at least one resonant structure, wherein a resonant structure comprises a plurality of semiconductor rod structures arranged into a row at intervals along a single arranging direction, and each of the semiconductor rod structures has a lattice constant along the arranging direction; the original broadband light propagates between the semiconductor rod structures, and producing a resonant light, wherein each of the semiconductor rod structures has a length perpendicular to the arranging direction and has a width parallel to the arranging direction, the length and the width is shorter than a wavelength of the resonant light;
   a cladding body, completely covering the semiconductor rod structures of the at least one resonant structure;
   a first substrate and a second substrate, wherein the cladding body and the at least one resonant structure are interposed between the first substrate and the second substrate;

wherein when a pressure is applied on at least one of the first substrate and the second substrate, the pressure is transmitted to the cladding body along a direction perpendicular to the arranging direction, a deformation corresponding to the pressure is occurred on the cladding body and the semiconductor rod structures on the arranging direction, and the wavelength of the resonant light is changed according to the deformation.

2. The pressure sensing device according to claim 1, further comprising a detector, receiving the resonant light to produce a spectral signal; and a processor, calculating a deformation value according to a change of the spectral signal.

3. The pressure sensing device according to claim 2, further comprising a first light-guiding portion and a second light-guiding portion, the first light-guiding portion and the second light-guiding portion are disposed in the cladding body along the arranging direction, the first light-guiding portion is configured to guide the original broadband light into a resonant structure, and the second light-guiding portion is configured to guide the resonant light into the detector.

4. The pressure sensing device according to claim 3, wherein the first light-guiding portion, the semiconductor rod structures of a resonant structure and the second light-guiding portion are arranged into a row along the arranging direction, an end of the first light-guiding portion faces the light source and another end of the first light-guiding portion faces the semiconductor rod structures, an end of the second light-guiding portion faces the semiconductor rod structures and another end of the second light-guiding portion faces the detector.

5. The pressure sensing device according to claim 3, wherein the first light-guiding portion and the second light-guiding portion are connected to form into a light-guiding structure, and disposed beside the semiconductor rod structures of a resonant structure arranged along the arranging direction.

6. The pressure sensing device according to claim 1, wherein a number of the at least one resonant structure is two, the resonant structures comprises a first resonant structure and a second resonant structure, the semiconductor rod structures of the first resonant structure are arranged into a first row, the semiconductor rod structures of the second resonant structure are arranged into a second row parallel and adjacent to the first row, and the semiconductor rod structures on the first row and the semiconductor rod structures on the second row have a gap on a gap direction perpendicular to the arranging direction.

7. The pressure sensing device according to claim 6, wherein when the pressure is transmitted to the cladding body through a direction simultaneously perpendicular to the arranging direction and perpendicular to the gap direction, a deformation is occurred on the cladding body and the semiconductor rod structures of the resonant structures on the gap direction, so that the gap is changed, wherein the wavelength of the resonant light is changed according to the change of the gap.

8. The pressure sensing device according to claim 1, wherein the light source is a back light source, disposed on a side of the cladding body, and a material of the semiconductor rod structures comprises a semiconductor material having a direct bandgap.

9. The pressure sensing device according to claim 2, further comprising a light-guiding structure, disposed in the cladding body, the semiconductor rod structures of a resonant structure and the light-guiding structure are arranged into a row along the arranging direction, an end of the light-guiding structure faces the semiconductor rod structures and another end of the light-guiding structure faces the detector, wherein the light-guiding structure is configured to guide the resonant light into the detector.

10. The pressure sensing device according to claim 2, further comprising a light-guiding structure, disposed beside the semiconductor rod structures of a resonant structure arranged along the arranging direction, and an end of the light-guiding structure faces the detector, wherein the resonant light enters the light-guiding structure through a coupling, and the light-guiding structure is configured to guide the resonant light into the detector.

11. A pressure sensing apparatus, comprising:
a light source, configured to provide an original broadband light;
a plurality of resonant structures, wherein each of the resonant structures comprises a plurality of semiconductor rod structures arranged into a row at intervals along a single arranging direction, and each of the semiconductor rod structures has a lattice constant on the arranging direction; at least part of the resonant structures arranged along a first direction, wherein at least part of the resonant structures are arranged along a second direction different from the first direction; the original broadband light entering at least part of the resonant structures and transmitted between the semiconductor rod structures, and producing a plurality of resonant lights, wherein each of the semiconductor rod structures of a resonant structure has a length perpendicular to the arranging direction and has a width parallel to the arranging direction, the length and the width are less than a wavelength of the resonant light;
a cladding body, completely covering the semiconductor rod structures of the resonant structures;
a first substrate and a second substrate, wherein the cladding body and the resonant structures are interposed between the first substrate and the second substrate;
wherein when a pressure is applied on at least one of the first substrate and the second substrate, and the pressure is transmitted to the cladding body along a direction perpendicular to the arranging direction, a deformation corresponding to the pressure is occurred on the cladding body and the semiconductor rod structures of the resonant structures on the arranging direction, so that a value of the lattice constants is changed, and the wavelength of the resonant lights is changed according to a change of the lattice constants.

12. The pressure sensing apparatus according to claim 11, further comprising a detector, receiving the resonant lights of at least part of the resonant structures to produce a plurality of spectral signals; and a processor, calculating an occurring location of the deformation and a deformation value of the deformation according to the spectral signals.

13. The pressure sensing apparatus according to claim 12, further comprising a plurality of first light-guiding portions and a plurality of second light-guiding portions, a first light-guiding portion and a second light-guiding portion are disposed in the cladding body along the arranging direction, a first light-guiding portion is configured to guide the original broadband light into a resonant structure, and a second light-guiding portion is configured to guide the resonant light into the detector.

14. The pressure sensing apparatus according to claim 13, wherein a first light-guiding portion, the semiconductor rod structures of a resonant structure and a second light-guiding portion are arranged into a row along the arranging direction, an end of the first light-guiding portion faces the light source and another end of the first light-guiding portion faces the semiconductor rod structures, an end of the second light-guiding portion faces the semiconductor rod structures and another end of the second light-guiding portion faces the detector.

15. The pressure sensing apparatus according to claim 13, wherein a first light-guiding portion and a second light-guiding portion are connected to form into a light-guiding structure, disposed beside the semiconductor rod structures of a resonant structure arranged along the arranging direction, an end of the light-guiding structure faces the light source and another end of the light-guiding structure faces the detector.

16. The pressure sensing apparatus according to claim 11, wherein the resonant structures comprises a plurality of first resonant structures and a plurality of second resonant structures, the semiconductor rod structures of a first resonant structure are arranged into a first row, the semiconductor rod structures of a second resonant structure are arranged into a second row parallel and adjacent to the first row, and the semiconductor rod structures on the first row and the semiconductor rod structures on the second row have a gap on a gap direction perpendicular to the arranging direction.

17. The pressure sensing apparatus according to claim 16, wherein when the pressure is transmitted to the cladding body through a direction simultaneously perpendicular to the arranging direction and perpendicular to the gap direction, a deformation is occurred on the cladding body and the semiconductor rod structures of the resonant structures on the gap direction, so that the gap is changed, wherein the wavelength of the resonant light is changed according to the change of the gap.

18. The pressure sensing apparatus according to claim 12, wherein the light source is a back light source, disposed on a side of the cladding body, and a material of the semiconductor rod structures of the resonant structures comprises a semiconductor material having a direct bandgap.

19. The pressure sensing apparatus according to claim 18, further comprising a plurality of light-guiding structures, disposed in the cladding body, the semiconductor rod structures of a resonant structure and a light-guiding structure are arranged into a row along the arranging direction, an end of the light-guiding structure faces the semiconductor rod structures and another end of the light-guiding structure faces the detector, wherein the light-guiding structure is configured to guide the resonant light into the detector.

20. The pressure sensing apparatus according to claim 18, further comprising a plurality of light-guiding structures, wherein a light-guiding structure is disposed beside the semiconductor rod structures of a resonant structure arranged along the arranging direction, and an end of the light-guiding structure faces the detector, wherein the resonant light enters the light-guiding structure through a coupling, and the light-guiding structure is configured to guide the resonant light into the detector.

* * * * *